US010082633B2

(12) United States Patent
Schaevitz et al.

(10) Patent No.: US 10,082,633 B2
(45) Date of Patent: Sep. 25, 2018

(54) WAFER-LEVEL INTEGRATED OPTO-ELECTRONIC MODULE

(71) Applicant: Corning Optical Communications LLC, Hickory, NC (US)

(72) Inventors: Rebecca Kayla Schaevitz, Sunnyvale, CA (US); Michael John Yadlowsky, Sunnyvale, CA (US); James Gavon Renfro, Jr., Pacifica, CA (US); Ian Armour McKay, Mountain View, CA (US)

(73) Assignee: Corning Optical Communications LLC, Hickory, NC (US)

( * ) Notice: Subject to any disclaimer, the term of this patent is extended or adjusted under 35 U.S.C. 154(b) by 0 days.

(21) Appl. No.: 15/216,136

(22) Filed: Jul. 21, 2016

(65) Prior Publication Data

US 2017/0031115 A1 Feb. 2, 2017

(30) Foreign Application Priority Data

Jul. 29, 2015 (EP) .................................... 15178897

(51) Int. Cl.
*G02B 6/42* (2006.01)
*G02B 6/12* (2006.01)
*H01S 5/022* (2006.01)
*H01S 5/183* (2006.01)

(52) U.S. Cl.
CPC ....... *G02B 6/4228* (2013.01); *G02B 6/12002* (2013.01); *G02B 6/424* (2013.01); *G02B 6/4204* (2013.01); *G02B 6/4206* (2013.01); *G02B 6/428* (2013.01); *G02B 6/4239* (2013.01); *H01S 5/02248* (2013.01); *H01S 5/02252* (2013.01); *H01S 5/02284* (2013.01); *H01S 5/183* (2013.01); *G02B 6/4214* (2013.01);

(Continued)

(58) Field of Classification Search
CPC .................................... G02B 6/42; G02B 6/12
USPC ............................................................ 385/14
See application file for complete search history.

(56) References Cited

U.S. PATENT DOCUMENTS 6,650,817 B2 * 11/2003 Murali ............... G02B 6/12002
385/131
7,224,856 B2 * 5/2007 Kathman ............. G02B 6/4201
385/14
7,288,758 B2 10/2007 Sherrer et al.
(Continued)

FOREIGN PATENT DOCUMENTS

GB 2454813 A 5/2009

OTHER PUBLICATIONS

US 8,792,758, 07/2014, Doscher et al. (withdrawn)
(Continued)

*Primary Examiner* — Kaveh C Kianni
(74) *Attorney, Agent, or Firm* — Michael E. Carroll, Jr.

(57) ABSTRACT

A method to manufacture optoelectronic modules comprises a step of providing a first wafer comprising a plurality of first module portions, wherein each of the first module portions comprises at least one passive optical component, providing a second wafer comprising a plurality of second module portions, wherein each of the second module portions comprises at least one optoelectronic component. The wafers are disposed on each other to provide a wafer stack that is diced into individual optoelectronic modules respectively comprising one of the first and the second and the third module portions.

4 Claims, 17 Drawing Sheets

(52) U.S. Cl.
CPC .......... *G02B 6/4231* (2013.01); *G02B 6/4274* (2013.01); *G02B 6/4292* (2013.01)

(56) References Cited

U.S. PATENT DOCUMENTS

| | | | |
|---|---|---|---|
| 7,355,166 B2 | 4/2008 | Sherrer et al. | |
| 7,358,109 B2 | 4/2008 | Gallup et al. | |
| 7,522,801 B2* | 4/2009 | Makita | G02B 6/42 385/129 |
| 7,961,989 B2* | 6/2011 | Kathman | G02B 6/4204 385/14 |
| 2002/0028045 A1* | 3/2002 | Yoshimura | G02B 6/10 385/50 |
| 2002/0054737 A1* | 5/2002 | Jian | G02B 6/423 385/49 |
| 2004/0217366 A1 | 11/2004 | Gale et al. | |
| 2005/0062055 A1 | 3/2005 | Gallup et al. | |
| 2005/0062122 A1 | 3/2005 | Gallup et al. | |
| 2005/0238278 A1* | 10/2005 | Nakashiba | B32B 15/08 385/14 |
| 2006/0097385 A1* | 5/2006 | Negley | H01L 33/486 257/722 |
| 2008/0211045 A1* | 9/2008 | Ono | H01L 27/14618 257/432 |
| 2009/0129422 A1 | 5/2009 | Edris et al. | |
| 2010/0151614 A1 | 6/2010 | Darbinyan et al. | |
| 2010/0205181 A1 | 8/2010 | Chidlovskii | |
| 2010/0270458 A1* | 10/2010 | Lake | H01L 21/76898 250/208.1 |
| 2013/0230273 A1 | 9/2013 | Doscher et al. | |
| 2013/0308898 A1* | 11/2013 | Doerr | G02B 6/428 385/14 |
| 2014/0010496 A1* | 1/2014 | Tong | G02B 6/4204 385/14 |
| 2014/0270659 A1* | 9/2014 | Schunk | G02B 6/4277 385/93 |
| 2015/0098677 A1 | 4/2015 | Thacker et al. | |
| 2016/0178861 A1* | 6/2016 | Osenbach | G02B 6/4251 385/14 |
| 2016/0225809 A1* | 8/2016 | Vittu | H01L 27/14618 |

OTHER PUBLICATIONS

European Extended Search Report for EP15178897.3 dated Feb. 8, 2016; 7 Pages; European Patent Office.

Higurashi, E., et al, "Three-Dimensional Integration of Optical Multi-Chips Using Surface-Activated Bonding for High-Density Microsystems Packaging," 2008 IEEE/LEOS International Conference on Optical MEMs and Nanophotonics, Aug. 11-14, 2008, pp. 62-63, DOI: 10.1109/OMEMS. 2008.4607829.

Doany, F., et al., "Terabit/s-Class Optical PCB Links Incorporating 360-Gb/s Bidirectional 850 nm Parallel Optical Transceivers," Journal of Lightwave Technology (vol. 30, Issue: 4 ), pp. 560-571, DOI: 10.1109/JLT. 2011.2177244.

Patel, C. S., et al., "Silicon Carrier with Deep Through-Vias, Fine Pitch Wiring and Through Cavity for Parallel Optical Transceiver," Proceedings Electronic Components and Technology, 2005. ECTC '05, May 31-Jun. 3, 2015, pp. 1318-1324, DOI: 10.1109/ECTC. 2005.1441439.

* cited by examiner

WAFER-LEVEL INTEGRATED OPTO-ELECTRONIC MODULE

CROSS-REFERENCE TO RELATED APPLICATIONS

This application claims the benefit of priority to European Application No. 15178897.3, filed on Jul. 29, 2015, the content of which is relied upon and incorporated herein by reference in its entirety.

FIELD

The disclosure is directed to a method to manufacture optoelectronic modules. The disclosure is further directed to an optoelectronic module.

BACKGROUND

The capability to provide sub-micrometer to few micrometer optical alignment accuracy has been a costly and time-consuming necessity in most optical communication components and devices because of the small dimensions of typical optical waveguides. As an example, in an active optical cable, PDs (Photodiodes) and multi-mode VCSELs (Vertical Cavity Surface Emitting Lasers) are placed individually within about 10-micrometer accuracy onto a populated PCB (Printed Circuit Board) with electronic components. This populated PCB is then moved to a different machine for wirebonding and once again back to the precision placement machine to place an optical element with lenses and a turning mirror. Fibers are brought onto the optical element on the PCB to complete the link to the optoelectronic module.

If any failures occur in this process, such as damaging a VCSEL or poor placement accuracy, the entire PCB is lost. This loss is expensive given the PCB must be pre-populated with all the electronics through the dirty surface mount technology (SMT) process prior to the final clean optical assembly described above. Additionally, each placement of PDs, VCSELs and a lens block has a tolerance of about 10 µm and thus creates a stack up allocation, i.e. the placement tolerances accumulate, for a larger error distribution in placement, which becomes especially problematic at higher data rates above 10 Gbps.

As a second example, silicon photonics structures use single mode operation, which must couple into a single mode fiber with apertures typically less than 10 µm. Consequently, alignment accuracies need to be within just a few micrometers, e.g. 2-1 µm, or better, to get reasonable optical coupling. The use of pick and place tooling, while capable of achieving these alignment accuracies, takes a significant amount of time and thus increases cost of the overall system.

It is a desire to provide a method to manufacture optoelectronic modules, wherein alignment tolerances between a respective optical fiber coupled to the optoelectronic modules, a respective at least one passive optical component and a respective at least one optoelectronic components of the modules, are reduced and wherein a large amount of the optoelectronic modules can be manufactured in a small amount of time. A further need is to provide an optoelectronic module, wherein alignment tolerances between an optical fiber coupled to the optoelectronic module, at least one passive optical component and at least one optoelectronic component of the module are reduced and wherein the optoelectronic module can be manufactured in a low time.

SUMMARY

According to an embodiment of a method to manufacture optoelectronic modules, a first wafer comprising a plurality of first module portions is provided, wherein each of the first module portions comprises at least one passive optical component, wherein the at least one passive optical component has a first and a second side and is configured to modify a beam of light such that a direction of light coupled in the at least one passive optical component at the first side is changed and coupled out of the at least one passive optical component at the second side. Furthermore, a second wafer comprising a plurality of second module portions is provided, wherein each of the second module portions comprises at least one optoelectronic component and metalized via holes extending in a material of the second wafer from a first surface of the second wafer to a second opposite surface of the second wafer, and wherein the respective at least one optoelectronic component of the second module portions is electrically connected to the respective metalized via holes of the second module portions. A third wafer comprising a plurality of third module portions is provided, wherein each of the third module portions comprises at least one electronic component.

The second wafer is bonded onto the third wafer such that the respective at least one electronic component of the third module portions is electrically coupled to the respective at least one optoelectronic component of the second module portions by means of the respective metalized via holes of the second module portions. Furthermore, the first wafer is bonded onto the second wafer to provide a wafer stack such that each of the first module portions is aligned to a respective one of the second module portions so that light coupled into the respective at least one passive optical component of the first module portions at the first side of the respective at least one passive optical component is coupled out at the second side of the respective at least one optical component and is directed to the respective at least one optoelectronic component of the second module portions.

The wafer stack is diced into individual optoelectronic modules respectively comprising one of the first and the second and the third module portions.

An embodiment of an optoelectronic module being manufactured by means of the method comprises a first substrate comprising a first module portion of the optoelectronic module including at least one passive optical component. The module comprises a second substrate comprising a second module portion of the optoelectronic module including at least one optoelectronic component. Furthermore, the module comprises a third substrate comprising a third module portion of the optoelectronic module, wherein the third module portion comprises at least one electronic component.

The first substrate has a first surface and a second opposite surface, wherein the at least one optical component is arranged on the first surface of the first substrate. The at least one passive optical component has a first and a second side and is configured to modify a beam of light such that a direction of light coupled in the at least one optical component at the first side is changed and coupled out of the at least one passive optical component at the second side.

The second substrate has a first surface and an opposite second surface, wherein the at least one optoelectronic component is arranged on the first surface of the second substrate. The second substrate comprises metalized via holes extending in a material of the second substrate from the first surface of the second substrate to the second surface of the second substrate. The at least one optoelectronic component is electrically connected to the metalized via holes.

The second substrate is bonded onto the third substrate such that the at least one electronic component of the third module portion is electrically coupled to the at least one optoelectronic component of the second substrate by the metalized via holes of the second substrate. The first substrate is bonded onto the second substrate such that the first module portion is aligned to the second module portion so that light coupled into the respective at least one passive optical component of the first module portion at the first side of the at least one optical component is coupled out at the second side of the at least one optical component and is directed to the at least one optoelectronic component of the second module portion.

The method allows to provide a plurality of optoelectronic modules, wherein the alignment tolerances between the respective at least one optoelectronic device, for example a photodiode, a laser or a silicon photonics chip, and the respective at least one passive optical component, and an optical fiber coupled to the respective optoelectronic module are in a range of a few micrometers, for example in a range of about 1-2 μm. Thus, it is possible to reduce fallout, cost and time of assembly of such modules and final PCBs. The method uses wafer-scale alignment and may further use wafer-scale testing while also making the final module SMT compatible.

The wafer-scale technique allows manufacturers to achieve the low alignment tolerances across hundreds to thousands of devices simultaneously, thus reducing overall cost and time. By also making it wafer-scale testable prior to assembly, fallout of the final assembled device on the PCB can be reduced. The modules may be designed to be compatible with typical semiconductor manufacturing processes, such as SMT, so that the optoelectronic module manufactured by the above-specified method can be integrated into a final product without added assembly cost. The method to manufacture the optoelectronic modules can be used for active optical cables, silicon photonics and optical fiber connections or potentially free-space connectivity across many industries. Additionally, the manufacturing method would enable the large volume that may ensue due to the wafer-scale design, low cost and ease of assembly. Lastly, the manufacturing tolerances provided could lend itself to making a low-cost, robust module capable of speeds much greater than 10 Gbps and thus provide a path toward innovation requiring high data rate communication.

BRIEF DESCRIPTION OF THE DRAWINGS

FIG. 2A shows several wafers to be stacked for manufacturing a plurality of optoelectronic modules.

DETAILED DESCRIPTION

The method to manufacture optoelectronic modules will now be described in more detail hereinafter with reference to the accompanying drawings showing different embodiments of the method. The method may, however, be embodied in many different forms and should not be construed as limited to the embodiments set forth herein; rather, these embodiments are provided so that the disclosure will fully convey the scope of the method to those skilled in the art. The drawings are not necessarily drawn to scale but are configured to clearly illustrate the method. The written text included in some of the Figures should facilitate the understanding of the Figures and particularly indicates examples of materials which may be used for the different components, substrates and layers but does not limit the possible materials that can be used for these components, substrates and layers to the materials specified in the Figures.

Figure 1:
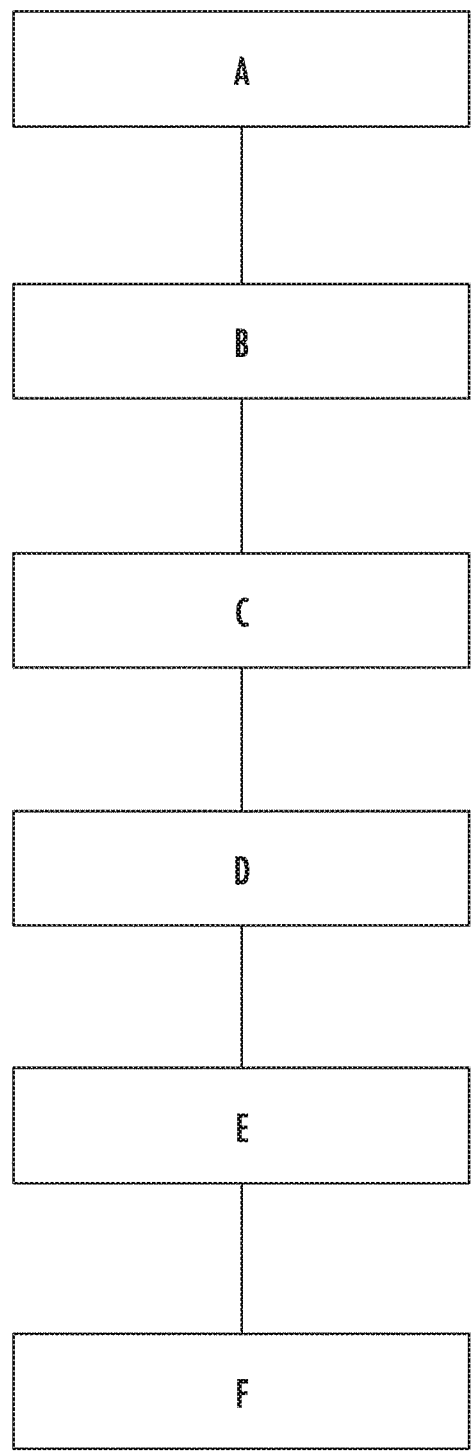
FIG. 1 shows an embodiment of a method to manufacture optoelectronic modules.
Figure 2B:
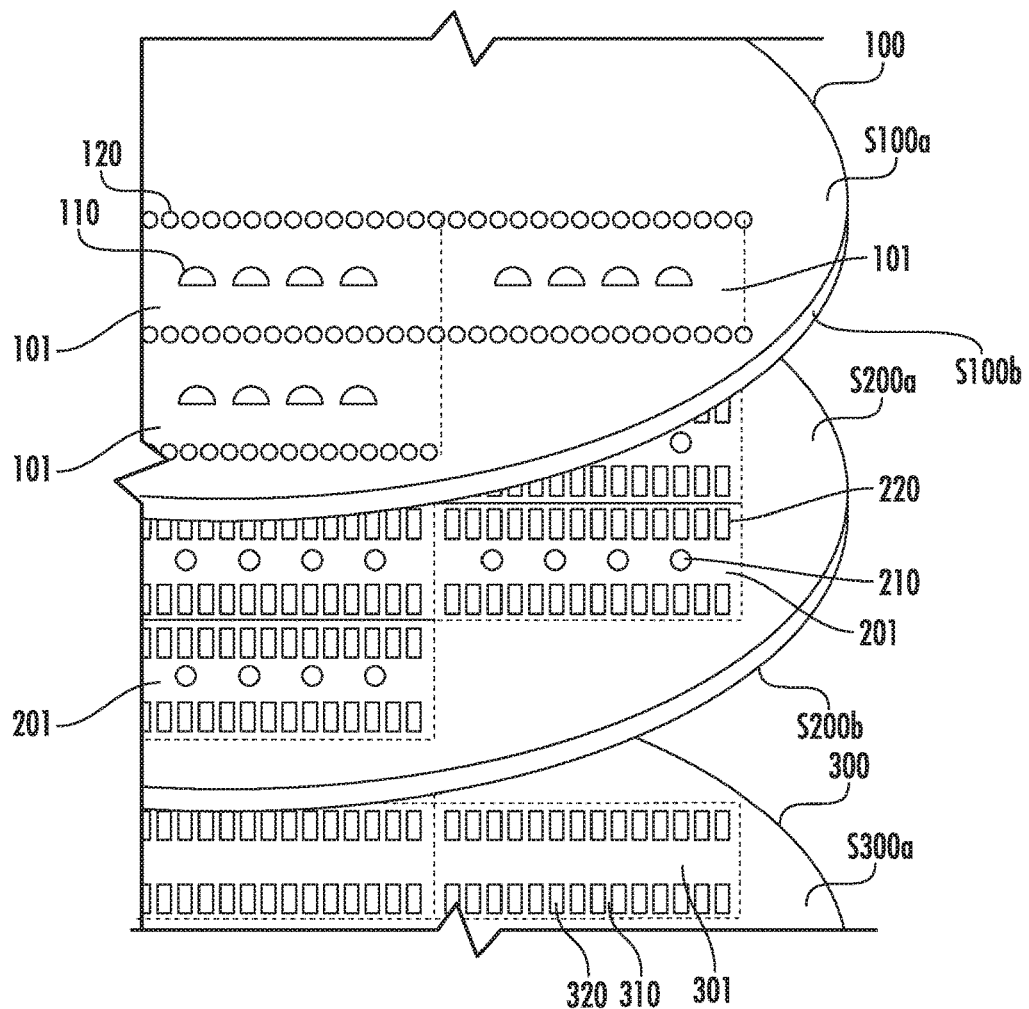
FIG. 2B shows an embodiment of stacked wafers for manufacturing a plurality of optoelectronic modules.
Figure 2B:
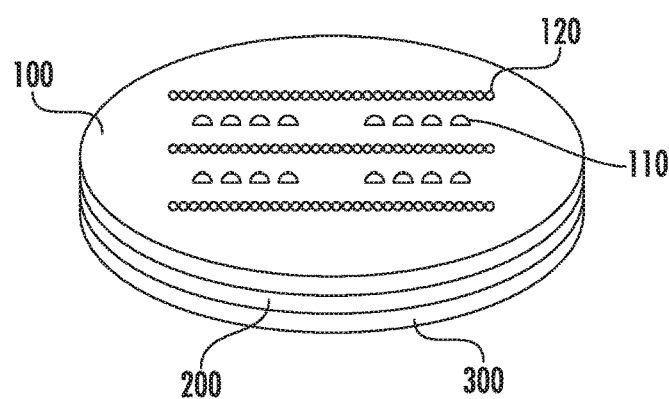

FIG. 1 shows steps A to F of a method to simultaneously manufacture a plurality of optoelectronic modules. The method is based on providing a wafer stack of several wafers 100, 200 and 300, wherein each of the wafers comprises respective different components of the optoelectronic modules. The wafer stack is diced into the individual optoelectronic modules. FIG. 2A illustrates respective embodiments of a first wafer 100, a second wafer 200 and a third wafer 300 to be stacked to each other. FIG. 2B shows the wafer stack of the bonded first wafer 100, the second wafer 200 and the third wafer 300.

According to a step A of the method to manufacture the optoelectronic modules, the first wafer 100 comprising a plurality of first module portions 101 is provided. Each of the first module portions 101 comprises at least one passive optical component 110. The at least one passive optical component 110 has a first and a second side and is configured to modify a beam of light such that a direction of the light coupled in the at least one passive optical component 110 at the first side is changed and coupled out of the at least one passive optical component 110 at the second side.

At least one optical fiber can be aligned to the at least one passive optical component 110 so that light may be coupled from the at least one optical fiber into the at least one passive optical component 110 or coupled out of the at least one passive optical component 110 into the at least one optical fiber. Optical fiber alignment components such as fixtures to hold and align an optical fiber can be mounted on the first wafer 100. According to another embodiment, the fiber alignment components can be configured as wafers stacked on top of the first wafer 100.

According to a subsequent step B, the second wafer 200 comprising a plurality of second module portions 201 is provided. Each of the second module portions 201 comprises at least one optoelectronic component 210 and metalized via holes 220 extending in a material of the second wafer 200 from a first surface S200a of the second wafer to a second opposite surface S200b of the second wafer. The respective at least one optoelectronic component 210 of the second module portions 201 is electrically connected to the respective metalized via holes 220 of the second module portions 201.

According to a subsequent step C, the third wafer 300 comprising a plurality of third module portions 301 is provided. Each of the third module portions comprises at least one electronic component 310.

According to a subsequent step D, the second wafer 200 is bonded onto the third wafer 300 such that the respective at least one electronic component 310 of the third module portions 301 is electrically coupled to the respective at least one optoelectronic component 210 of the second module portions 201 by means of the respective metalized via holes 220 of the second module portions 201.

According to a subsequent step E, the first wafer 100 is bonded onto the second wafer 200 to provide a wafer stack such that each of the first module portions 101 is aligned to a respective one of the second module portions 201 so that light coupled into the respective at least one passive optical component 110 of the first module portions 101 at the first side of the respective at least one passive optical component 110 is coupled out at the second side of the respective at least one optical component 110 and is directed to the respective at least one optoelectronic component 210 of the second module portions 201.

According to a subsequent step F, the wafer stack comprising the first wafer 100, the second wafer 200, and the third wafer 300 is diced into individual dies respectively comprising one of the first and the second and the third module portions 101, 201 and 301 for respectively forming one of the optoelectronic modules. Each of the optoelectronic modules is formed by a respective first module portion 101 of the first wafer 100, a respective second module portion 201 of the second wafer 200 and a respective third module portion 301 of the third wafer 300, wherein the respective first, second and third module portions are stacked and bonded above each other.

The first wafer 100 is provided in the step A with a first surface S100a and a second surface S100b being opposite to the first surface S100a. The respective at least one passive optical component 110 of each of the first module portions 101 is arranged on the first surface S100a of the first wafer 100. The second wafer 200 is provided in step B with the respective at least one optoelectronic component 210 of each of the second module portions 200 being arranged on the first surface S200a of the second wafer 200. According to an embodiment of method step C, the first wafer 100 is bonded onto the second wafer 200 such that the second surface S100b of the first wafer 100 is disposed on the first surface S200a of the second wafer 200.

Figure 3:
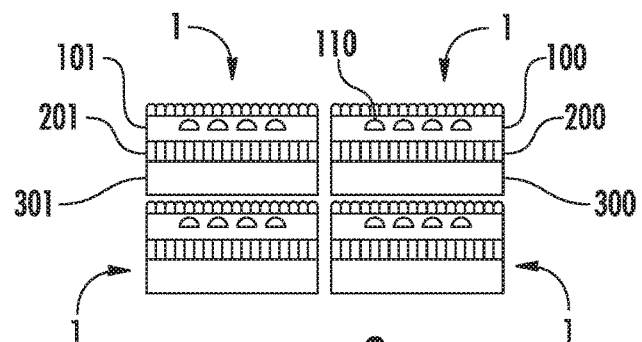
FIG. 3 shows an embodiment of optoelectronic modules of three substrates.

FIG. 3 shows several optoelectronic modules 1 after being diced out of the wafer stack comprising the first wafer 100, the second wafer 200 and the third wafer 300. Each of the optoelectronic modules 1 comprises a first substrate 100' being cut out of the first wafer 100 of the wafer stack and comprising the first module portion 101 of the respective optoelectronic module including the at least one passive optical component 110. Furthermore, each of the optoelectronic modules 1 comprise a second substrate 200' being cut out of the second wafer 200 of the wafer stack and comprising the second module portion 201 of the respective optoelectronic module including the at least one optoelectronic component 210. Each of the optoelectronic modules further comprises a third substrate 300' being cut out of the third wafer 300 of the wafer stack and comprising the third module portion 301 of the optoelectronic module, wherein the third module portion 301 comprises the at least one electronic component 310.

The first substrate 100' has a first surface and a second opposite surface, wherein the at least one passive optical component 110 is arranged on the first surface of the first substrate 100. The at least one passive optical component 110 has a first and a second side and is configured to modify a beam of light such that a direction of the light coupled in the at least one optical component 110 at the first side is changed and coupled out of the at least one passive optical component 110 at the second side.

The second substrate 200' has a first surface and an opposite second surface, wherein the at least one optoelectronic component 210 is arranged on the first surface of the second substrate 200'. The second substrate 200' comprises the metalized via holes 220 extending in a material of the second substrate 200' from the first surface of the second substrate to the second surface of the second substrate. The at least one optoelectronic component 210 is electrically connected to the metalized via holes 220.

The second substrate 200' is bonded onto the third substrate 300' such that the at least one electronic component 310 of the third module portion 301 is electrically coupled to the at least one optoelectronic component 210 of the second module portion 201 by the metalized via holes 220 of the second substrate 200'. The first substrate 100' is bonded onto the second substrate 200' such that the first module portion 101 is aligned to the second module portion 201 so that light coupled into the respective at least one passive optical component 110 of the first module portion 101 at the first side of the at least one optical component is coupled out at the second side of the at least one optical component 110 and is directed to the at least one optoelectronic component 210 of the second module portion 201.

According to an embodiment of the method to manufacture the optoelectronic module, the second wafer 200 may be configured as a GaAs or a silicon photonics wafer or an InP wafer. The first wafer 100 may be configured as one of a glass wafer and an opaque polymer wafer with holes drilled out and filled with a transparent polymer. The respective at least one passive optical component 110 of the first module portions 101 may comprise an optical lens and/or a light turning element, for example an optical mirror, being configured to change a direction of the light beam, for example by TIR (Total Internal Reflection), so that light is coupled between an optical fiber coupled to the respective first module portions 101 and the respective at least one passive optical component 110 of the first module portions 101.

The respective at least one optoelectronic component 210 of the second module portions 201 may be configured as an optical emitter, for example a VCSEL, and/or an optical receiver, for example a photodiode. The respective at least one electronic component 310 of the third module portions 301 may be configured as an electrical driver and/or an electrical amplifier.

As explained above, the first opto-mechanical wafer 100 may comprises a substrate of glass. Glass can provide a flat surface to mold optical components, such as lenses and turning mirrors, on the first wafer 100. Glass can also have precision features etched into its surface and through the first wafer 100 to allow for any mechanical alignment of optical fibers or other components. Furthermore, glass can be designed with coefficients of thermal expansion (CTEs) similar to semiconductor wafers, thus improving reliability of the final optoelectronic modules over large temperature ranges. Lastly, glass is an ideal substrate for high-speed signal integrity and both metal traces and vias can be made on it.

Figure 4:
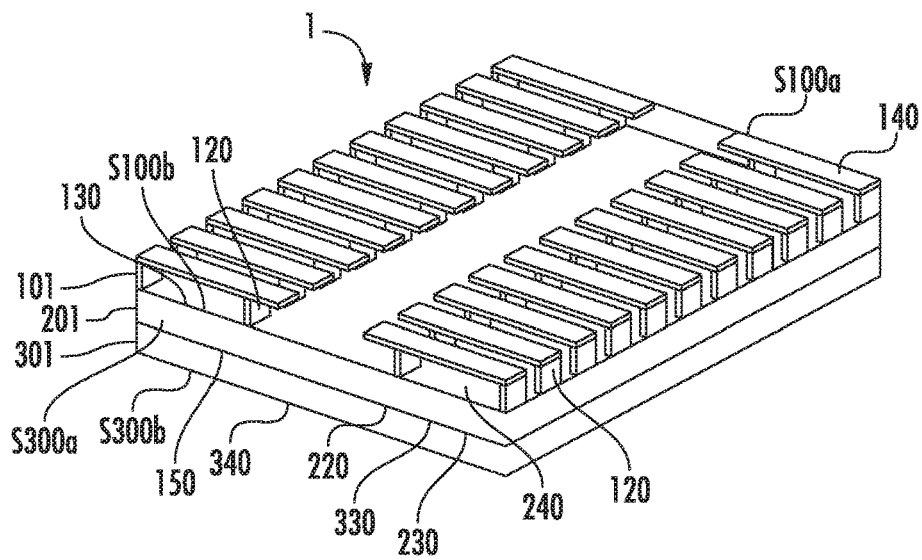
FIG. 4 shows a perspective view of a cutout of stacked wafers for manufacturing a plurality of optoelectronic modules.

FIG. 4 shows a perspective view of an embodiment of an optoelectronic module 1 after dicing the wafer-scale stack in perspective view, wherein each of the first, second and third module portions 101, 201 and 301 comprises electrical contact pads to provide an external electrical connection to the electrical and/or optoelectronic components of the module or to electrically connect the electrical and optoelectronic components to each other.

According to an embodiment of the method to manufacture the optoelectronic modules, the second wafer 200 can be provided in method step B with respective electrical contact pads 230 for each of the second module portions 201. The respective electrical contact pads 210 are electrically coupled to the respective metalized via holes 220 of the second module portions 201. The respective electrical contact pads 230 are arranged on the second surface S200b of the second wafer 200.

In method step C, the third wafer 300 is provided with respective electrical contact pads 330 for each of the third module portions 301. The respective electrical contact pads 330 are electrically coupled with the respective at least one electronic component 310 of the third module portions 301. The respective electrical contact pads 330 are arranged on a surface S300a of the third wafer.

According to an embodiment of method step D, the second wafer 200 is bonded onto the third wafer 300 such that the second surface S200b of the second wafer 200 is disposed on the surface S300a of the third wafer 300 and the respective electrical contact pads 330 of the third module portions 301 are aligned to the respective electrical contact pads 230 of the second module portions 201 to provide an electrical connection between the respective electrical contact pads 330 of the third module portions 301 and the respective electrical contact pads 230 of the second module portions 201.

According to an embodiment of the method to manufacture the optoelectronic modules, the third wafer 300 is provided in method step A with respective metalized via holes 320 for each of the third module portions 301 in a material of the third wafer 300. The respective metalized via holes 320 extend from the first surface S300a of the third wafer 300 to a second opposite surface S300b of the third wafer 300. The respective electrical contact pads 330 of the third module portions 301 arranged on the first surface S300a of the third wafer 300 are electrically coupled to the respective metalized via holes 320 of the third module portions 301.

The third wafer 300 is provided with respective electrical contact pads 340 for each of the third module portions 301 on the second surface S300b of the third wafer 300. The respective electrical contact pads 340 of the third module portions 301 on the second surface S300b are electrically coupled to the respective metalized via holes 320 of the third module portions 301. According to the embodiment of the optoelectronic module 1 shown in FIG. 4, the optoelectronic module comprises the electrical contact pads 330 and 340 being arranged on both surfaces S300a and S300b of the wafer 300.

According to a further embodiment of the method to manufacture the optoelectronic modules, the first wafer 100 is provided in method step A with respective metalized via holes 120 for each of the first module portions 101 in a material of the first wafer 100. The respective metalized via holes 120 extend from the first surface S100a of the first wafer 100 to the second surface S100b of the first wafer 100.

According to an embodiment of the method step B, the second wafer 200 is provided with respective electrical contact pads 240 for each of the second module portions 201 on the first surface S200a of the second wafer 200 such that the respective electrical contact pads 240 of the second module portions 201 are electrically connected to the respective metalized via holes 220 of the second module portions 201.

According to an embodiment of the method step E, the first wafer 100 is bonded onto the second wafer 200 such that the respective electrical contact pads 240 of the second module portions 201 are electrically connected to the respective metalized via holes 120 of the first module portions 101.

According to another embodiment of the method to manufacture the optoelectronic modules, the first wafer 100 is provided in method step A with respective electrical contact pads 130 for each of the first module portions 101 on the second surface S100b of the first wafer such that the respective electrical contact pads 130 of the first module portions 101 are electrically connected to the respective metalized via holes 120 of the first module portions 101.

Furthermore, the first wafer 100 can be provided in method step A with a conductive redistribution layer 150 on the second surface S100b of the first wafer 100. The conductive redistribution layer 150 comprises respective conductive traces for each of the first module portions 101, wherein the respective conductive traces of the conductive redistribution layer 150 are arranged to electrically couple the respective contact pads 130 of the first module portions 101 on the second surface S100b of the first wafer 100 to the respective metalized via holes 120 of the first module portions 101.

According to the embodiment of the optoelectronic module 1 shown in FIG. 4, the first module portion 101 comprises electrical contact pads 130 arranged on the second surface S100b of the wafer 100 and electrical contact pads 140 arranged on the first surface S100a of the first wafer 100. The electrical contact pads 140 on the top surface S100a of the first wafer 100 could allow for flip-chip bonding of the optoelectronic module 1.

According to an embodiment of the method to manufacture the optoelectronic modules, the second wafer 200 comprising the second module portions 201 with the respective optoelectronic components 210 is configured as a wafer made of GaAs. The electrical signals would traverse from the top surface of the third wafer 300 comprising the third module portions with the respective electronic components through the GaAs vias 220 of the second wafer 200 to the first wafer 100 comprising opto-mechanical components 110 to connect the electrical signals to an external electronic board, for example a PCB.

Additionally, the vias 220 would electrically connect the second wafer 200 to the third wafer 300 containing either laser drivers or receiver amplifiers as electronic components to drive the optoelectronic components, for example the VCSELs or PDs, of the second wafer respectively. In this implementation, the top first wafer 100 would have passive optical components such as lenses and turning mirrors, as well as opto-mechanical components for fiber attachment components and also comprises electrical traces and vias to connect to an external board such as a PCB. In configuring the stack up using GaAs vias, very well controlled impedances and electrical losses capable of achieving very high data rates are provided.

Another possible implementation utilizing via technology would be in SiP with vias through silicon. In this implementation, the second wafer 200 is configured as a Silicon Photonics wafer. The electrical signals from the bottom third (electronic) wafer 300 comprising the electronic components could either traverse from the top to the bottom of the third (electronic) wafer 300 or from the top of the third (electronic) wafer 300 through the middle second (SiP optoelectronic) wafer 200 to the top first (opto-mechanical) wafer 100. The top of the electronic wafer 300 would also be connected to the middle SiP optoelectronic wafer 200 in order to drive the transmitter and receiver optoelectronic devices 210. In this implementation, the top opto-mechanical wafer 100 may optionally have electrical connectivity.

The specified method utilizes (GaAs, Si or other wafer-based) via fabrication technology to reduce parasitics of wirebonding optoelectronic devices for III-V wafers and in other cases for multi-chip integration of Si-based electronic components. For the purpose of the specified method, vias enable compact wafer-level integration of optical sources and detectors on a wafer, such as a GaAs or silicon photonics wafer, sandwiched between the third (bottom) wafer 300 having electronic functions such as laser drivers and receiver amplifiers, for example Si CMOS or SiGe Bi-CMOS, and the first (top) wafer 100 having passive optical components, for example lenses, turning mirrors, fiber alignment components as well as possibly components for electrical connectivity.

According to an embodiment of the method to manufacture the optoelectronic modules, the wafer stack comprising the bonded first, second and third wafer 100, 200 and 300 may be diced along the respective metalized via holes 120 of the first module portions 101 of the first wafer 100 into the individual dies/optoelectronic modules 1 to create half- or castellated vias in the first wafer 100. As shown for the optoelectronic module 1 of FIG. 4, vias 120 are arranged in the material of the first wafer 100 extending from the first surface S100a to the second surface S100b of the first wafer 100. In order to separate the optoelectronic module 1, the first wafer 100 is diced through the metalized vias 120 such that half- or castellated vias are created. The castellated vias could allow for perpendicular/edge bonding of the optoelectronic module as illustrated below in FIG. 8A.

Figure 5:
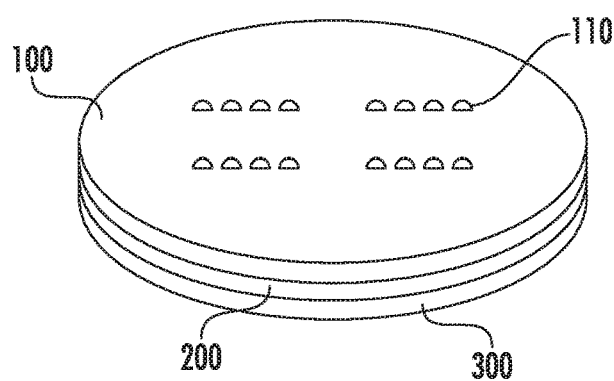
FIG. 5 shows an embodiment of stacked wafers for manufacturing a plurality of optoelectronic modules.

FIG. 5 shows another embodiment of a wafer stack comprising the first wafer 100, the second wafer 200 and the third wafer 300. In contrast to the embodiment of the wafer stack shown in FIG. 2B, the first wafer 100 is provided without any metalized vias through the first wafer 100 for backside mounting. Fiber alignment components to hold and align the optical fibers to the optical components 110 can be mounted on the first wafer 100. According to another embodiment, the fiber alignment components can be configured as wafers stacked on top of the first wafer 100. After being stacked and aligned the wafer stack is diced into individual optoelectronic modules.

Figure 6:
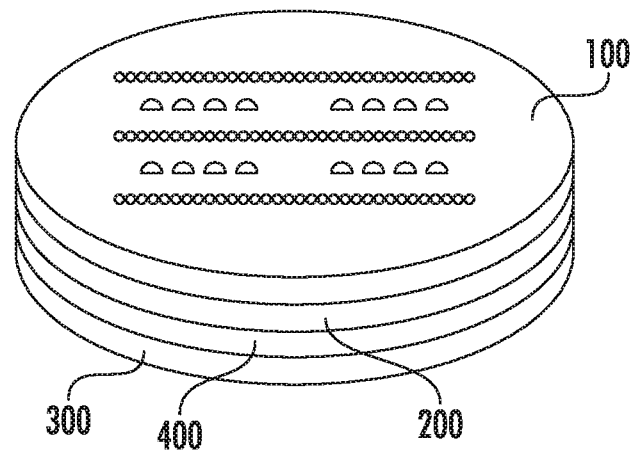
FIG. 6 shows an embodiment of stacked wafers for manufacturing a plurality of optoelectronic modules.

According to a possible embodiment of the method to manufacture the optoelectronic modules 1, a fourth wafer 400 configured for thermal isolation may be provided in method step D between the third wafer 300 and the second wafer 200, wherein the fourth wafer 400 comprises metalized via holes in a material of the fourth wafer, wherein the metalized via holes are arranged to electrically couple the respective electrical contact pads 330 of the third module portions 301 to the respective electrical contact pads 230 of the second module portions 201. FIG. 6 shows an embodiment of a wafer stack comprising the first wafer 100, the second wafer 200, the third wafer 300 and the fourth wafer 400.

The fourth wafer 400 serves as to improve thermal isolation of the second (optoelectronic) wafer 200 from the first (electronic) wafer 300. The insertion of the fourth wafer 400 allows to protect the optoelectronic components 210, for example an optical source and detector of the second wafer 200, from the electronic components 310, for example drive electronics of the third wafer. The fourth wafer 400 may be configured as a glass interposer wafer with metal vias and redistribution layers between the third and the second wafers 300 and 200. In this variation, the wafer stack up would include a total of four wafers beginning at the bottom with the third (electronic) wafer 300, followed by the fourth wafer 400 acting as a thermal isolation wafer, the second (optoelectronic) wafer 200 and, at the top, the first (opto-mechanical) wafer 100. The isolation may especially be important for the VCSEL sub-assembly where the output optical power as well as the threshold current is affected significantly by temperature especially as data rates increase, but also may be important in SiP (Silicon Photonics) where some devices are temperature sensitive.

Figure 7:
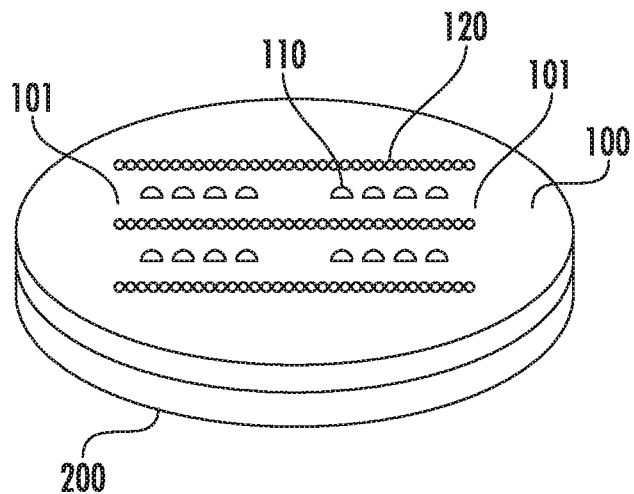
FIG. 7 shows an embodiment of stacked wafers for manufacturing a plurality of optoelectronic modules.

FIG. 7 shows an embodiment of a wafer stack comprising just the first wafer 100 and the second wafer 200. The first wafer 100 comprises first module portions 101 comprising at least one passive optical component 110 and metalized via holes 120. The second wafer 200 comprises the second module portions 201 comprising at least one optoelectronic component and metalized via holes extending in the material of the second wafer 200. In contrast to the embodiment of the wafer stack shown in FIG. 2B, the wafer stack does not comprise the third wafer 300. For this embodiment, only one set of vias are needed, either in the first wafer 100 or the second wafer 200, but not both. Vias in the first wafer 100 would allow for downward or horizontal mounting as shown in FIG. 8B, 9B or 11B, while vias in the second wafer 200 would allow for mounting as shown in FIG. 10*b*, 12*a*, 12*b* or 12*c*.

FIGS. 8A to 12C show different arrangements of an optoelectronic module 1 on an electronic board 3. The optoelectronic module 1 shown in FIGS. 8A, 9A, 10A and 11A comprises the third substrate 300' with electronic components 310, such as drivers or amplifiers integrated in the substrate 300', the second substrate 200' with the optoelectronic components 210, for example photodiodes or VCSELs, and the first substrate 100' with the passive optical components 110, such as optical lenses. The first substrate 100' may also include electrical and/or opto-mechanical components. The second substrate 200' contains electrical vias 220 to electrically couple the electronic components of the third substrate 300' with the optoelectronic components of the second substrate. The electronic components and the optoelectronic components may be electrically coupled to the electronic board by means of electrical traces disposed on a surface of the first substrate 100', as shown, for example, in the embodiments of FIGS. 8A, 9A and 11A. In the embodiment shown in FIG. 10A, there are no electrical contacts to the first substrate 100', but there are electrical vias in the third substrate 300' to connect to the electronic board 3.

Figure 8A:
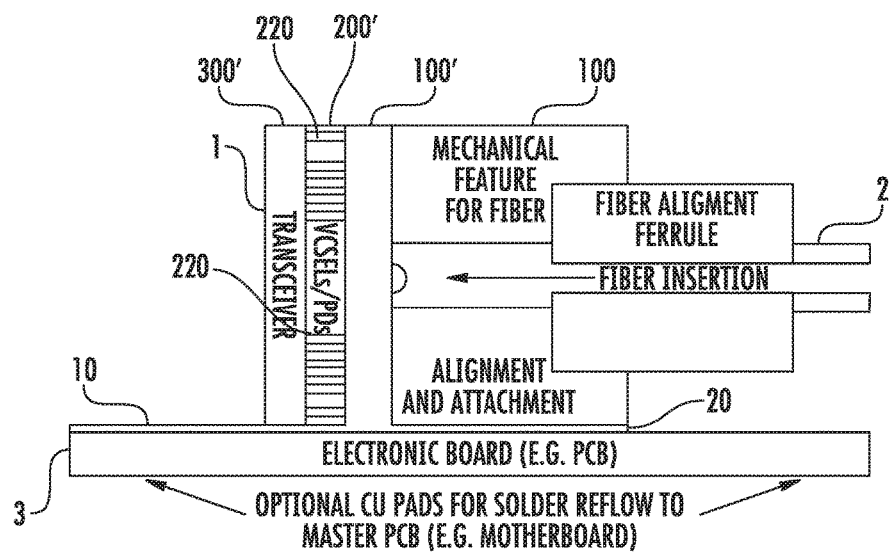
FIG. 8A shows a perpendicular attachment of an embodiment of an optoelectronic module onto an electronic board.
Figure 8B:
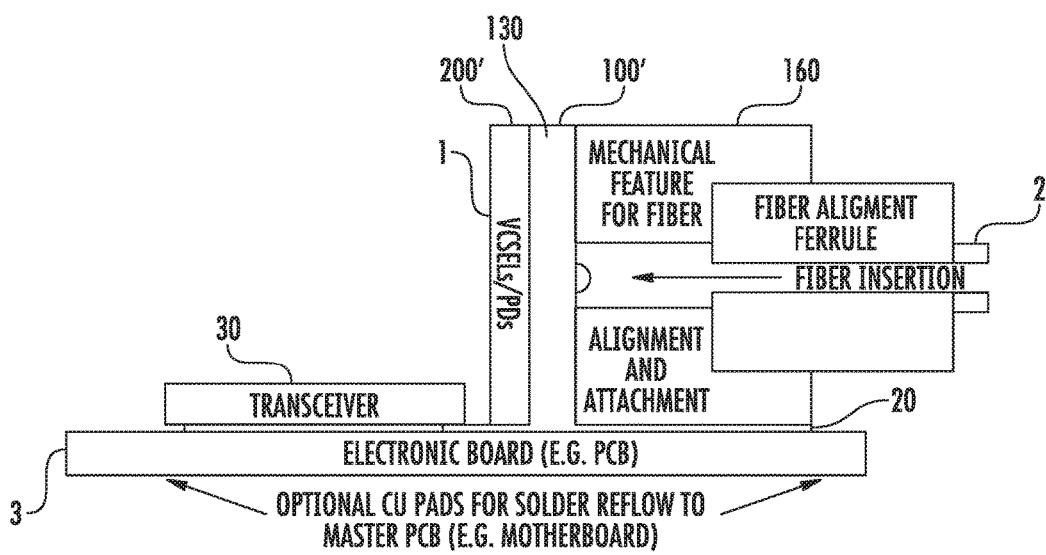
FIG. 8B shows a perpendicular attachment of an embodiment of an optoelectronic module onto an electronic board.
Figure 9A:
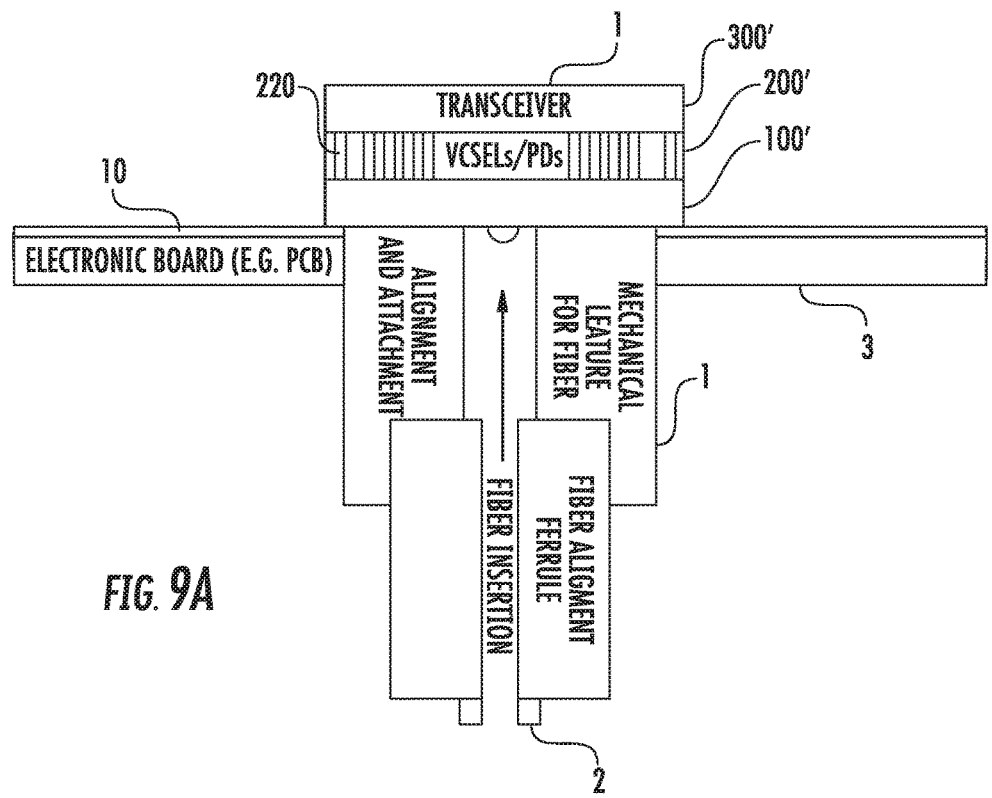
FIG. 9A shows a downward attachment of an embodiment of an optoelectronic module onto an electronic board.
Figure 9B:
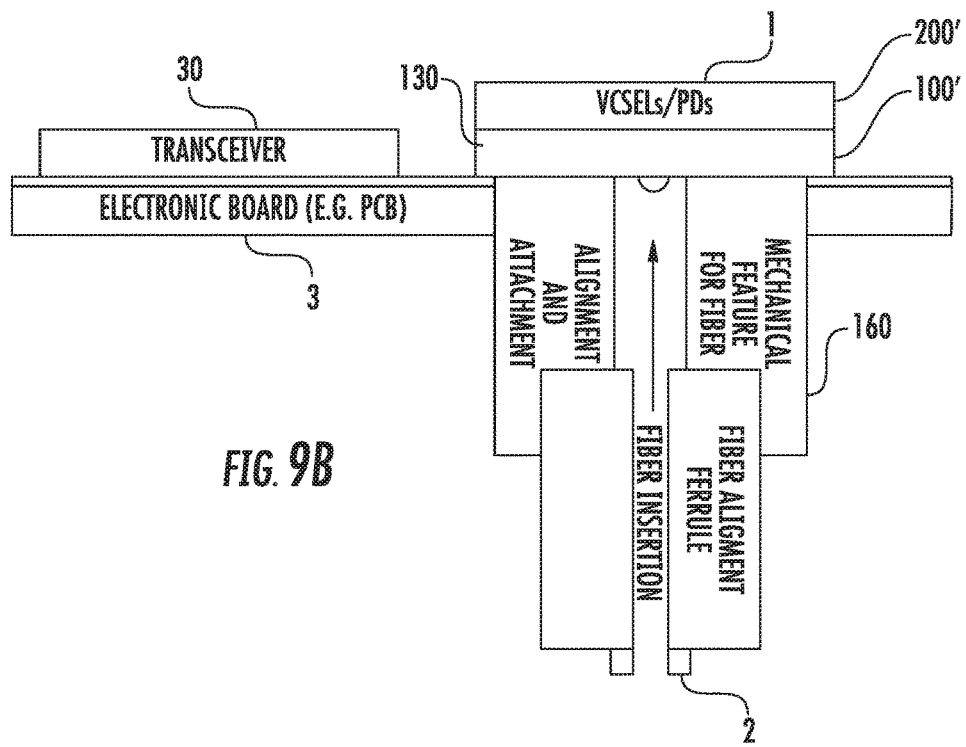
FIG. 9B shows a downward attachment of an embodiment of an optoelectronic module onto an electronic board.
Figure 10A:
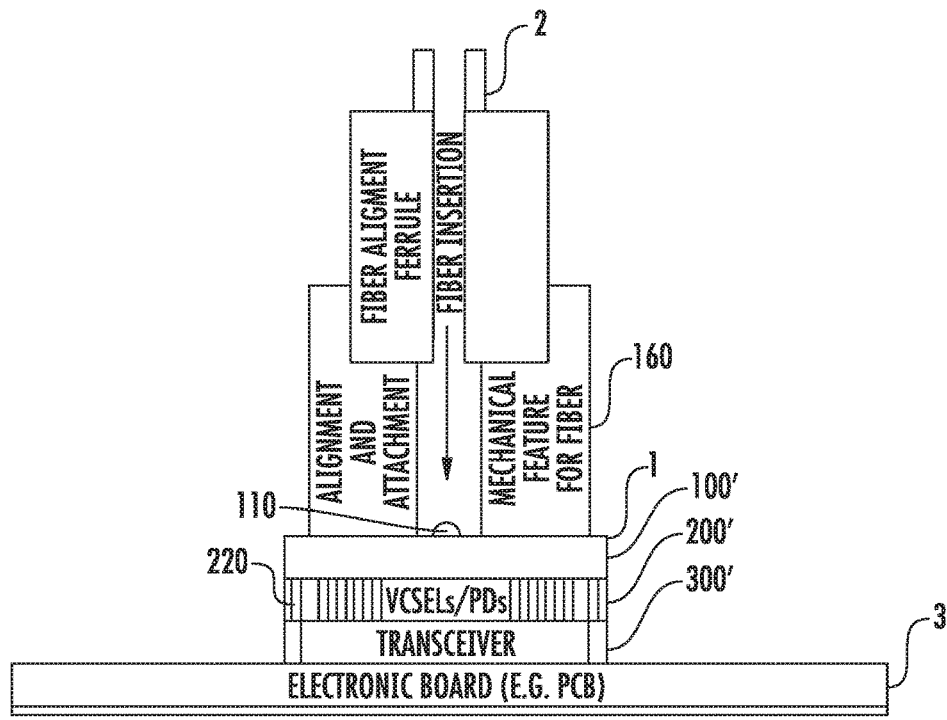
FIG. 10A shows a vertical attachment of an embodiment of an optoelectronic module onto an electronic board.
Figure 10B:
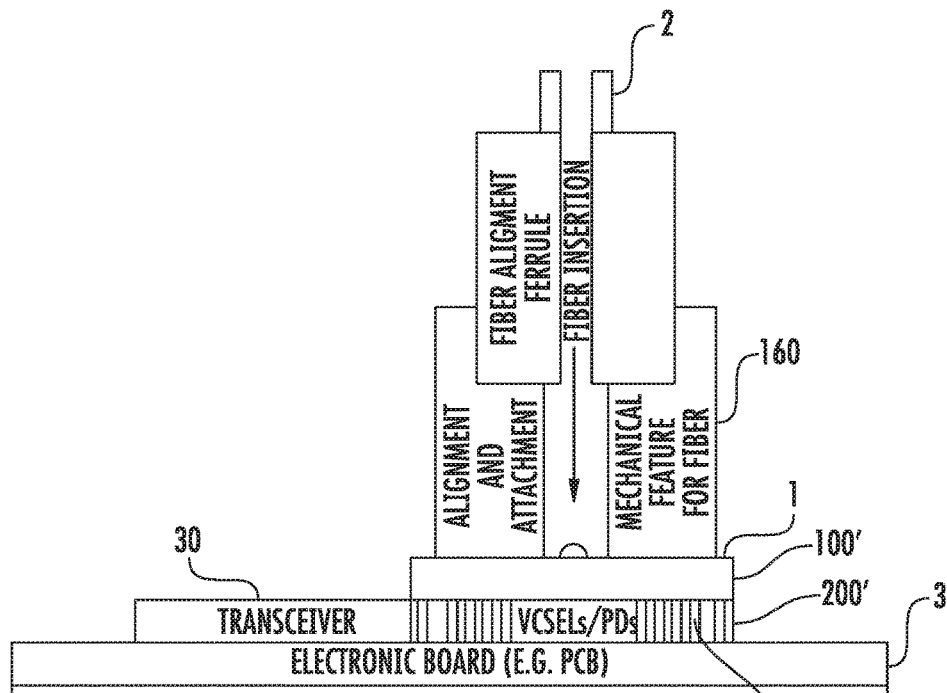
FIG. 10B shows a vertical attachment of an embodiment of an optoelectronic module onto an electronic board.
Figure 11A:
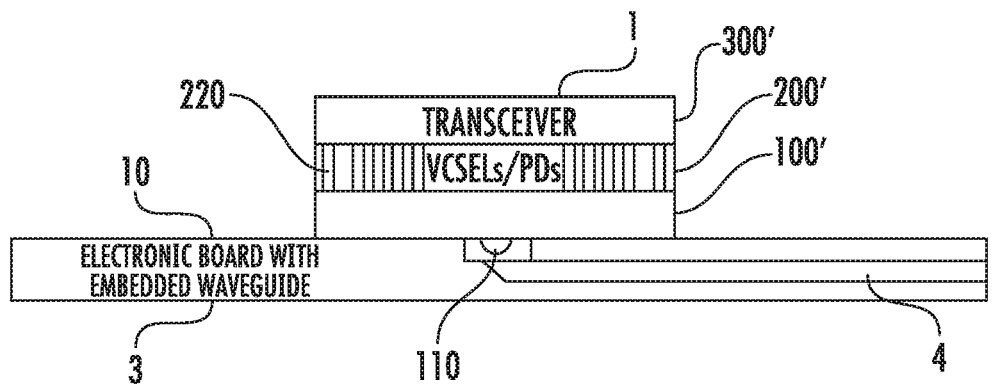
FIG. 11A shows a downward attachment of an embodiment of an optoelectronic module onto an opto-electronic board with an embedded waveguide.
Figure 11B:
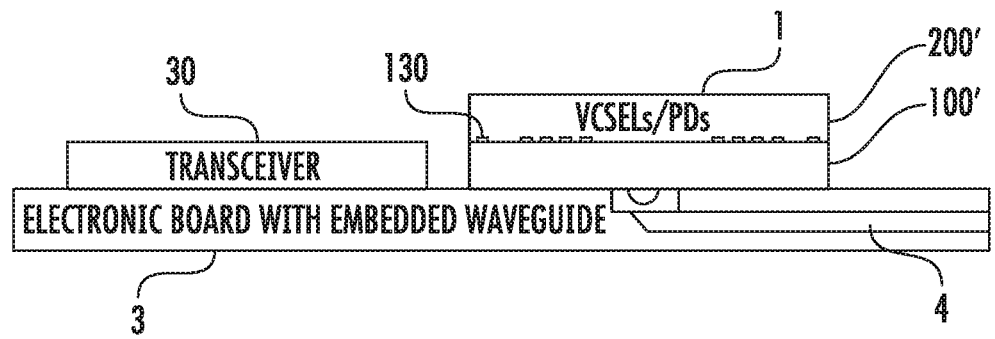
FIG. 11B shows a downward attachment of an embodiment of an optoelectronic module onto an opto-electronic board with an embedded waveguide.

The optoelectronic module 1 shown in FIGS. 8B, 9B, 10B, 11B and 12A to 12C only comprises the first substrate 100' and the second substrate 200' but does not comprise the third substrate 300'. According to the embodiments shown in FIGS. 8B, 9B, 10B, 11B and 12A to 12C the electronic components are provided as separate, individual devices 30 directly mounted on the electronic board 3. The optoelectronic module 1 is provided by dicing the wafer stack shown in FIG. 7 into individual modules. The first substrate 100' may or may not comprise electrical vias/metalized via holes. FIGS. 8*b*, 9*b* and 11*b* show embodiments with vias in the first substrate 100' connecting the second substrate 200'. The vias on the first substrate 100' can then connect to the electronic board 3 by means of castellated vias (FIG. 8*b*) or electronic contact pads (FIGS. 9*b* and 11*b*). The electronic connection then provides electrical connectivity between the second substrate 200' and the electronic components 30 being mounted on the electronic board 3. FIGS. 10*b* and 12A to 12C show examples where the first substrate 100' do not comprise electrical vias/metalized via holes or any metal redistribution layers. In the alternate embodiment, substrate 200' comprises of electrical vias/metalized via holes in order to connect to the electronic board 3 and, in particular, to the electronic components 30 being mounted on the electronic board 3.

According to embodiments of an arrangement of the optoelectronic module 1 on the electronic board 3, shown in FIGS. 8A and 8B, the optoelectronic module 1 is perpendicularly attached onto the electronic board 3. To this purpose, the first wafer 100 may comprise castellated vias 110 as described above and shown in FIG. 4. Metal traces 10 may be arranged on the electronic board 3 to connect the optoelectronic module 1, for example by means of the castellated vias, to electronic components of the electronic board 2. Metallic pads, for example Cu pads, may be optionally be provided on the backside of the electronic board 3 for solder reflow to a master PCB, for example a motherboard. A glue 20 may be applied to the surface of the electronic board 3 to provide any stability for mounting the optoelectronic module 1 to the board 3.

FIGS. 9A and 9B respectively show an embodiment of an arrangement of an optoelectronic module 1 onto an electronic board 3, for example a printed circuit board, wherein the optoelectronic module 1 is attached downward onto the electronic board 3. Metal traces 10 are provided on a surface of the electronic board 3 to electrically connect the electronic components of the electronic board 3 to the optoelectronic module 1.

FIGS. 10A and 10B respectively show an embodiment of an arrangement of an optoelectronic module 1 onto an electronic board 3, wherein the optoelectronic module 1 is vertically mounted onto the electronic board 3. The optoelectronic module 1 shown in FIG. 10A is provided by dicing the wafer stack shown in FIG. 5 into individual modules. The optoelectronic module 1 shown in FIG. 10B is provided by dicing a wafer stack only comprising the first wafer 100 and the second wafer 200, wherein the first wafer does not comprise electrical vias. The optical fiber 2 is held and aligned by means of an alignment component, for example, a fixture 160. The fixture 160 may be configured as an individual component mounted/attached on the surface of the first substrate 100' or as a wafer/wafers with or without molded elements stacked on top of the first substrate 100'.

FIGS. 11A and 11B respectively show an embodiment of a downward arrangement of an optoelectronic module 1 onto an opto-electronic board 3. Metal traces 10 are provided on a surface of the opto-electronic board to electrically connect the electronic components of the opto-electronic board 3 to the optoelectronic module 1. Electrical vias are provided in the first substrate 100' to make the electrical connection between the electronic board 3 and the second substrate 200' (and the third substrate 300' for the embodiment of FIG. 11A). The opto-electronic board 3 may comprise a channel to insert a waveguide 4 being embedded in the opto-electronic board 3 such that a front face of the embedded waveguide 4 is arranged in a cavity of the opto-electronic board 3 under the passive optical component 110, for example a lens, of the optoelectronic module. Light may be coupled from the front face of the embedded waveguide 4 through the passive optical component 110 into the optoelectronic module 1 and vice versa. To this purpose, the opto-electronic board 3 may comprises a mirror/TIR component to change the direction in order to aid in the coupling of light.

Figure 12A:
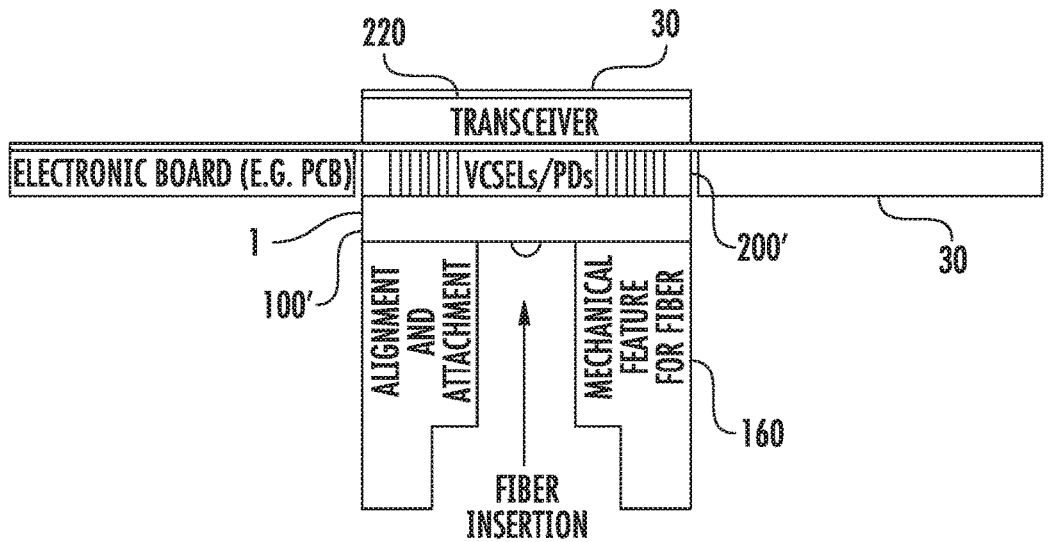
FIG. 12A shows an embodiment of a downward arrangement of an optoelectronic module onto an electronic board.
Figure 12B:
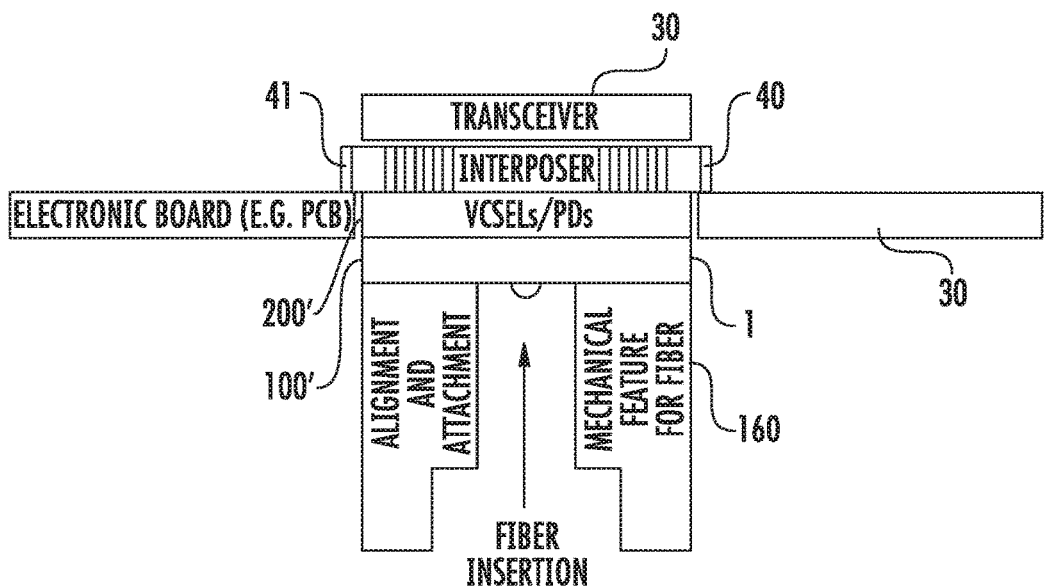
FIG. 12B shows an embodiment of a downward arrangement of an optoelectronic module onto an electronic board.
Figure 12C:
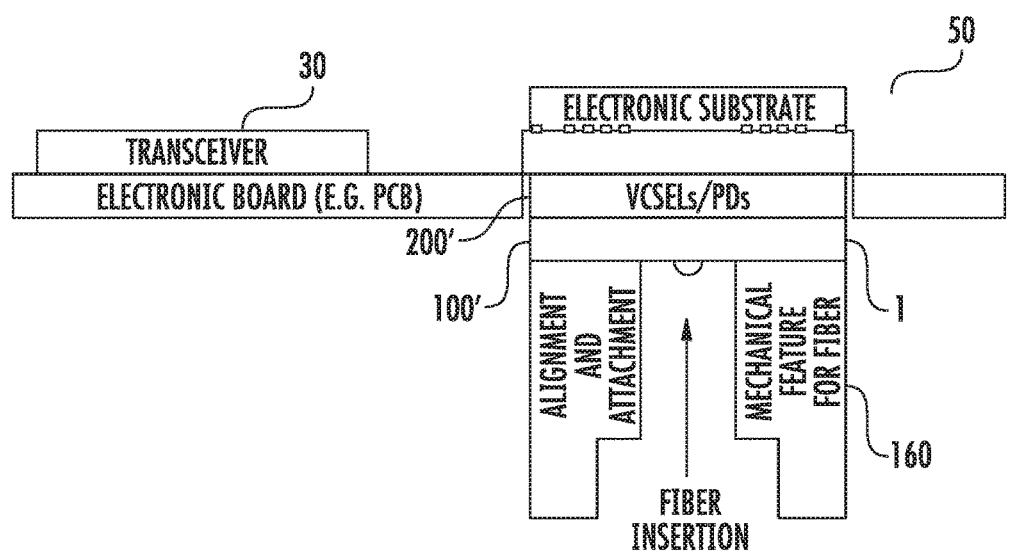
FIG. 12C shows an embodiment of a downward arrangement of an optoelectronic module onto an electronic board.

FIGS. 12A to 12C show downward approaches of arrangements of an optoelectronic module 1 comprising the first (opto-mechanical) substrate 100' and the second (optoelectronic) substrate 200'. The optoelectronic module 1 has no wafer-scale IC integration. The optoelectronic module 1 has only a wafer-scale integration with the first (opto-mechanical) wafer 100 and the second (optoelectronic) wafer 200 and possibly with a fiber alignment component made up of multiple wafers or molded components on a single wafer. The optoelectronic module 1 is provided by dicing the wafer stack as shown in FIG. 7 into individual modules. The electronic board 3 is provided with a cutout to place the optoelectronic module 1 to different components.

FIG. 12A shows an embodiment of an arrangement of an optoelectronic module 1 comprising the opto-mechanical substrate 100' which can be made of glass and the optoelectronic substrate 200' on the electronic board 3. The optoelectronic module 1 is electrically bonded onto the electronic component 30, for example a transceiver. The optoelectronic substrate 200' is disposed onto the electronic component 30. The optoelectronic substrate 200' contains metallized via holes 220, i.e. electrical vias, to electrically couple the optoelectronic components of the optoelectronic substrate 200' to the electrical component 30. The electrical component 30 is electrically coupled to the electronic board 3.

FIG. 12B shows another embodiment of an arrangement of an optoelectronic module 1 comprising the opto-mechanical substrate 100' which can be made of glass and the optoelectronic substrate 200' on the electronic board 3. The optoelectronic module 1 is bonded onto an interposer 40 along with the electronic component 30, for example a transceiver. The interposer 40 comprises electrical vias 41 to electrically couple the optoelectronic components of the optoelectronic substrate 200' to the electrical component 30 and electrical vias 42 to electrically couple the optoelectronic components and the electrical component 30 to the electronic board 3.

FIG. 12C shows another embodiment of an arrangement of an optoelectronic module 1 comprising the opto-mechanical substrate 100' which can be made of glass and the optoelectronic substrate 200' on the electronic board 3. The optoelectronic substrate 200' is placed onto an electronic substrate 50. The optoelectronic components of the optoelectronic substrate 200' are electrically coupled to the electronic board 3 via electrical traces of the electronic substrate 50. The electronic component 30 is mounted to a side of the electronic board 3.

According to an embodiment of the method to manufacture the optoelectronic modules, the first opto-mechanical wafer 100 may be provided with mechanical elements to fix the optical fiber 2 to the module 1 with high precision and exact alignment, thus creating a robust and well-aligned optical link. To this purpose, in method step A, a respective at least one fixture 160 fabricated from a wafer with molded alignment features or a stack of wafers with varying sized vias may be placed for each of the first module portions 101 on the first surface S100a of the first wafer 100 to couple a respective at least one optical fiber 2 to the first module portions 101, as shown in FIGS. 8A to 10B and in FIGS. 12A to 12C. The respective at least one fixture 160 is configured to hold the respective at least one optical fiber 2 and to align the respective at least one optical fiber 2 to the respective at least one passive optical component 110 of the first module portions 101 such that light is coupled between the respective at least one optical fiber 2 and the respective at least one passive optical component 110 of the first module portions 101.

According to another embodiment of the method to manufacture the optoelectronic components, the respective at least one fixture 160 is configured to provide a distance between a front face of the respective at least one optical fiber 2 coupled to the first module portions 101 and the respective at least one passive optical component 110 of the first module portions 101.

The fixture may be made by wafer scale process molding directly onto the first wafer and/or is one of a single wafer and several stacked wafers with varying holes or molded elements to form the fixture and bonded to the first wafer at the wafer scale.

FIGS. 8A to 12C show the fixture 160 being placed on the first surface S100a of the first module portion 101 of the optoelectronic module 1 to hold and align the optical fiber 2 to the passive optical component 110. The fixture 160 may comprise protrusions 161 being configured to hold the optical fiber 2 in a distance far away from the passive optical component 110. According to a possible embodiment, the fixture 160 can be made of a single wafer with molded components. According to another embodiment, the fixture can be made of a stack of wafers with varying sized holes and aligned to the first wafer 100 in the same fashion that the first wafer 100 is aligned to the second wafer 200. According to another embodiment, the fixture 160 may comprise individual fixture elements bonded precisely to each module.

For the majority of implementations described above, metal traces and vias on the first opto-mechanical wafer 100 are used to connect signals to an external PCB. This concept is shown for example in FIGS. 2A and 2B. The sub-assembly could be mounted onto a PCB perpendicular to its surface as shown in FIGS. 8A and 8B.

Since the overall footprint of the optoelectronic modules can be reduced by stacking the second (optoelectronic) wafer 200 on top of the third (electronic) wafer 300 or IC, it is conceivable this implementation could even work for applications with limited vertical space. An example of such an application is an active optical cable assembly in which this module would be integrated into the board residing in the plug of the cable.

Alternatively, the vias in the first opto-mechanical wafer 100 could be designed such that the metal connections are on the opposite side of the wafer and the module could be mounted horizontally as shown in FIGS. 9A and 9B. In the horizontal arrangement, the electronic board 3 would need a cutout to allow for the optical path through the electronic board or it would need to be an optical PCB with embedded waveguides as shown in FIGS. 9A and 9B. By architecting the solution horizontally, it may be possible to improve heat extraction and the electrical signaling characteristics. Such a solution may benefit applications where speed, power and heat are paramount, such as in data centers and server farms.

According to another embodiment of the method to manufacture the optoelectronic modules, a spacer layer may be provided on the first surface S100a of the first wafer 100 to provide a distance between a front face of the respective at least one optical fiber 2 coupled to the first module portions 101 and the respective at least one passive optical component 110 of the first module portions 101.

According to a further embodiment of the method to manufacture the optoelectronic modules 1, the functionality of the bonded respective first and second module portions 101, 201 and/or the bonded respective third and second module portions 301, 201 and/or the bonded respective first and second and third module portions 101, 201, 301 is tested in the method step D before dicing the wafer stack into the individual dies. According to another embodiment, the functionality of the optoelectronic modules is tested before dicing the bonded first, second and third wafer in method step E into the individual dies/optoelectronic modules.

In order to make the final optoelectronic module compatible to SMT (Surface Mounted Technology), the respective materials of the first, second and third wafer must be chosen appropriately and a covering element could be needed over the optical and mechanical alignment features to prevent debris from compromising that area. According to a possible embodiment of the method to manufacture the optoelectronic modules, the covering element may be placed on the first surface S100a of the first wafer 100 to protect the respective at least one passive optical component 110 of the first module portions 101 from debris when dicing the wafer stack into the individual dies and/or to assist with fiber alignment. Alternatively a cleaning step may be used in place of a protective cover.

The covering element could prove useful during the dicing process of the wafer as well as during SMT. Thus, the cover should be placed prior to singulation (at the wafer-scale) and removed following the entire SMT process and just before fiber insertion. Additionally, the cover could be placed back onto the module following fiber insertion to add mechanical support and alignment of the fiber.

The integration of the three wafers, i.e. the bottom electrical, the middle optoelectronic and the top opto-mechanical wafers 300, 200 and 100 provides many possible benefits. One benefit is the compact integration of the second (optoelectronic) wafer 200, for example GaAs VCSEL or silicon photonics wafer, with the third (bottom electrical) wafer 300, which leads to very well controlled impedances and parasitics critical for data rates above 10 Gbps.

A second benefit is the tight alignment accuracies and parallelism of alignment over hundreds to thousands of modules of the first (opto-mechanical) wafer 100 to the second (optoelectronic) wafer 200, critical for high-speed multi-mode as well as single-mode operation. A third benefit is the capability to have easy access to electrical signals external to the module either by vias through the second (optoelectronic) wafer 200 connecting the top of the third (electronic) wafer 300 to the first (opto-mechanical) wafer 100 or alternatively vias through the third (electronic) wafer 300 connecting the top to the bottom of the third wafer 300.

A fourth benefit is the compact size of the entire subassemblies after dicing the wafer-stack of the first, second and third wafer. A fifth benefit is the compatibility of a final optoelectronic module with traditional electronic processing technologies, such as Surface Mount Technology (SMT). A sixth benefit is that the platform can be used for both multi-mode and single-mode optical integration given the very tight optical alignment tolerances, allowing for use with traditional VCSEL-based multi-mode optics as well as Silicon Photonics (SiP) single-mode optics with all light emission is surface normal. And lastly, these optoelectronic subassemblies have the further capability of wafer-scale testing to produce "known-good modules".

The method to manufacture optoelectronic modules is described in the following by process steps for manufacturing an optoelectronic receiver module using the first opto-mechanical wafer 100, the second optoelectronic wafer 200 and the third electronic wafer 300, wherein a GaAs approach is assumed to be used for the second wafer 200.

According to a first method step, the electronic wafer 300 is designed with module portions 301 respectively comprising a receiver integrated circuit (IC) and top electrical pads having a pitch easily fabricated on a low-cost electronic circuit substrate, for example a PCB. An example pitch would be 0.25 mm where the pads and spacing widths are 0.125 mm. Variation of this design is valid presuming the electrical signal integrity is good and the integration onto an electronic board remains feasible.

In a subsequent step the optoelectronic wafer 200 is designed with second module portions 201 respectively comprising a GaAs photodiode with pad locations, spacing and widths that match the receiver IC and through GaAs vias to replicate the location, spacing and widths of the electrical pads on the backside of the optoelectronic GaAs wafer 200.

After fabrication of the electronic and optoelectronic wafers, thermo-compression or other means may be applied to electrically bond the optoelectronic GaAs wafer 200 onto the electronic wafer 300, and align the electrical pads on the top surface of the electronic wafer 300 to the pads on the bottom surface of the optoelectronic GaAs wafer 200.

Some of the electrical pads on the top surface of the optoelectronic GaAs wafer 200 need only connect to the bottom electronic wafer 300, for example those that connect to the photodiode, while other pads need to connect eventually to the electronic board, for example a PCB. The layout of the pads and the subsequent metal redistribution layer on the glass substrate should reflect that connection requirement.

According to a subsequent step, the stacked wafers 300 and 200 are tested for optical and electrical functionality, for example, by using an optical and electrical probe system.

The electrical portion of the opto-mechanical wafer 100 may be designed with an electrical redistribution layer from trace pads aligned to the optoelectronic GaAs wafer 200 top surface to metalized vias in the glass. The vias should be designed such that dicing would occur through the via and provide sufficient metal remaining in the half- or castellated-via to create contacts in a perpendicular orientation.

Alternatively, the vias could be of the non-castellated type and flipped onto a PCB. Following the electrical design, opto-mechanical components including polymer lenses, spacer layers, mechanical alignment features to align optical fibers to the lenses and provide an optimized optical path are designed. After the design phase, the opto-mechanical wafer 100 can be fabricated by the steps of creating through-glass vias (TGVs), metalizing glass vias, metalizing glass redistribution layer and contact pads, plating up metal lines and contacts as needed, molding polymer lenses on alternate side, optionally placing a spacer layer, optionally placing an optical turn, placing fiber alignment features and placing mechanical fixturing features for the fiber holder, all of which may be done at the wafer scale.

In a subsequent step thermo-compression or other means of electrical bonding is provided to bond the top surface of electronic/optoelectronic wafer stackup onto the metalized side of the opto-mechanical wafer 100 so that the photodiodes are aligned with the lenses within low tolerance, for example an accuracy of less than 2 µm. Additionally, an index matching gel can be placed between the photodiode surface and the glass to minimize reflections on the surfaces.

The modules may be tested on the wafer-scale before dicing, wherein any may be marked that fail to meet manufacturing standards for electrical and optical connectivity. After the testing, a removable wafer-scale covering element may be placed over the opto-mechanical features on the top surface of the opto-mechanical wafer 100. The stacked wafers 300, 200 and 100 are then diced into individual optoelectronic modules, cleaned and the temporary covering element is removed.

The singularized final optoelectronic modules may be visually tested and additionally tested in a test fixture for good electrical and optical connectivity for perpendicular, vertical or downward surface mounting to a PCB. Afterwards, the temporary covering element is replaced for shipping and as a possible final fiber alignment mechanical fixture.

One alternative process flow in which the electronic wafer 300 is not part of the optoelectronic module as shown for the wafer stack in FIG. 7 would change a few of the steps described above. The first step would change such that some or possibly none of the metal pads on the IC need match the GaAs substrate of the optoelectronic wafer. The step of bonding the electronic and the optoelectronic wafer would be removed. According to a possible embodiment, the steps of designing and fabricating the opto-mechanical wafer 100 would not need any of the metallization described. The opto-mechanical wafer could still have metallization in some embodiments as shown in FIGS. 8B, 9B and 11B, and have it mounted on the side or flip chipped and with the silicon IC on the electronic board or glass interposer instead of in the stack up. The step of bonding the opto-mechanical wafer 100 onto the optoelectronic wafer 200 could only need index matching epoxy and no electrical connection according to a possible embodiment. After the step of testing the optoelectronic module and replacing the temporary cover, an additional step is needed to apply thermo-compression, or by other means, mount the optoelectronic module onto an electronic wafer for good electrical connection.

Alternatively, the last step could be to mount the optoelectronic module onto a glass interposer with the electronic chip mounted to the backside or to the side for thermal isolation or to a common substrate, such as a PCB. The final module would then be tested for electrical and optical performance. These possible embodiments are represented in FIGS. 12A to 12C.

Alternatively, the last step could be to mount the optoelectronic module to the final electronic board 3 with the electronic chip mounted to the side as shown in FIGS. 8B, 9B, 10B and 11B.

For the silicon photonics process, the same steps above could be used with the GaAs wafer 200 replaced by a silicon photonics wafer 200. Additionally, it would be possible to integrate both receiver and transmitter functionality onto one wafer rather than having two separate process flows. The silicon photonics process could also be slightly altered such that the electrical tracing going externally to an electronic board goes through the electronic wafer rather than through the SiP wafer to the opto-mechanical wafer. In this process flow, the first step of designing the electronic wafer 300 would also need to design through Si vias to the backside to match with standard PCB or similar electronic board capabilities. The steps of designing and fabricating the opto-mechanical wafer 100 would not need any of the metallization described for the opto-mechanical wafer. The step of bonding the opto-mechanical wafer 100 to the optoelectronic wafer 200 would only need index matching epoxy and no electrical connection. According to another possible embodiment, the opto-mechanical wafer 100 may still have the electronic connection through the opto-mechanical wafer with the Silicon IC chip either disposed on a common substrate or the stacked up module bonded onto the Silicon IC, where the IC is a larger chip than the module.

Another variation to the method to manufacture optoelectronic modules could be a mix of wafer-level integration with chip-based integration used in silicon-based electronics. In this implementation, wafer-level integration of just the two top wafers, i.e. the optoelectronic wafer (GaAs, SiP or other) 200 and the opto-mechanical wafer 100, is performed. In this case, the two wafers 100 and 200 would be bonded solely with index-matching epoxy and have no electrical connectivity while still maintaining the advantages of wafer-level fabrication for the optical and fiber attach elements. According to another embodiment, it is possible to consider having metalization here for downward or flip chip connections as well, for example, either through metal redistribution layers and/or vias. The arrangement is shown in FIGS. 8B, 9B, 10B and 11B with the IC mounted on the PCB, or as shown below in FIG. 14 where the surface S200b of the optoelectronic wafer would have a metal redistribution layer in order to connect the VCSELs, PDs and Driver/Receiver circuitry.

This two-layer stack would form the sub-assembly to then be diced into individual optoelectronic modules, which can be electrically connected at the bottom of the module, i.e. the bottom of the optoelectronic wafer, using the same via design as the previous three-layer stack. Since the two-layer stack no longer directly integrates the electronic wafer functionality into the wafer-level integration, it is necessary to subsequently integrate the singularized optoelectronic module, i.e. the diced two-layer stack, with an electronic chip or a diced electronic wafer. One possible method to do this final integration with an electronic chip could be to bond the optoelectronic module directly on top of an electronic chip or an interposer substrate typically referred to as 2.5D or 3D integration in silicon processing. Alternatively, the module could be soldered, e.g. through Surface Mount Technology (SMT), directly to an electronic board, such as a PCB, with nearby electronic chips with laser drive and receiver amplification.

Embodiments of a method to manufacture the optoelectronic modules comprising at least two substrates cut out of a wafer stack comprising at least the first (opto-mechanical) wafer 100 and the second (optoelectronic) wafer 200 are described with reference to FIGS. 13A and 13B.

Figure 13A:
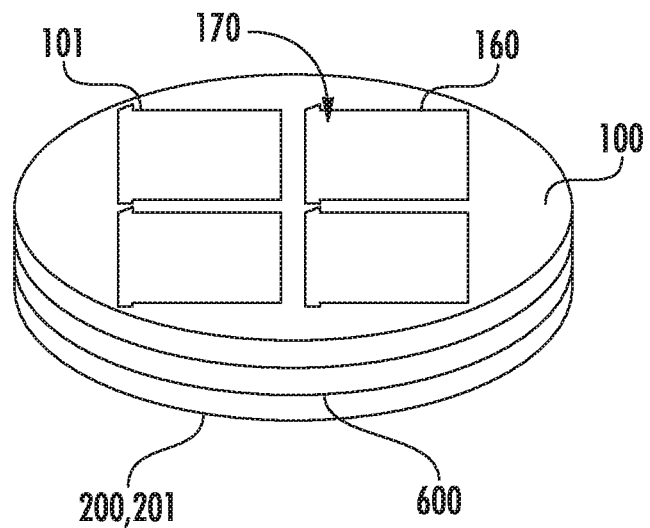
FIG. 13A shows an embodiment of several stacked wafers for manufacturing a plurality of optoelectronic modules.

FIG. 13A shows a wafer stack comprising the first (opto-mechanical) wafer 100 comprising alignment components 160, such as v-grooves, and light turning elements 170 based on TIR (Total Internal Reflection). The first wafer 100 does not comprise any electrical vias through the material of the first wafer 100, for example a glass material. The wafer stack further comprises a spacer wafer 600 bonded below the opto-mechanical wafer 100 and the second (optoelectronic) wafer 200 arranged on the bottom side of the spacer wafer 600. The optoelectronic wafer 200 can be made of glass. Electronic components, for example a transceiver, and optoelectronic components, for example, a VCSEL and/or a PD can be placed on a surface of the optoelectronic wafer 200.

Figure 13B:
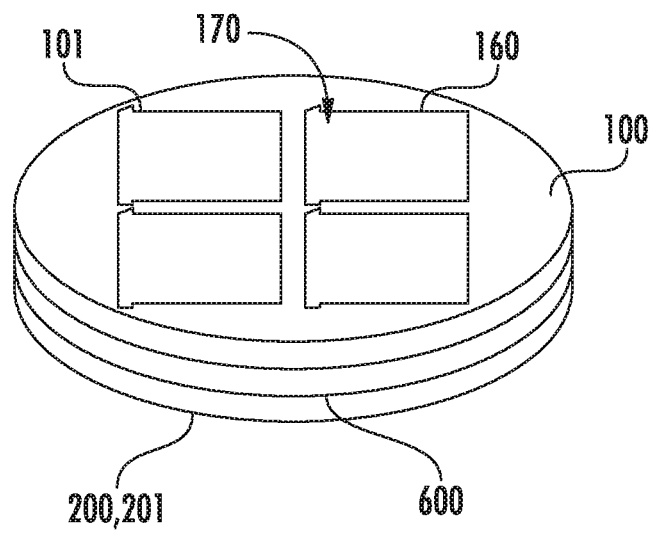
FIG. 13B shows an embodiment of several stacked wafers for manufacturing a plurality of optoelectronic modules.

FIG. 13B shows a wafer stack comprising an opto-mechanical wafer 100, a spacer wafer 600 and an optoelectronic wafer 200. The opto-mechanical wafer 100 is placed on the top side of the wafer stack and the optoelectronic wafer 200 is placed on the bottom side of the wafer stack. The spacer wafer 600 is arranged between the opto-mechanical wafer 100 and the optoelectronic wafer 200. The optoelectronic wafer 200 may be configured as an electronic board, for example a PCB with individual electronic and opto-electronic components arranged on top of the electronic board within an opening of the spacer wafer as shown below in FIG. 19. Alternatively, the optoelectronic wafer 200 may be configured as a SiP wafer with backside electrical connections.

According to an embodiment of a method to manufacture optoelectronic modules, a wafer stack as shown in FIG. 13A is provided. The wafer stack comprises a first (opto-mechanical) wafer 100 comprising a plurality of first (opto-mechanical) module portions 101, wherein each of the first (opto-mechanical) module portions 101 comprises at least one fixture 160, which is molded at the wafer scale onto the surface of the first wafer 100, to hold an optical fiber 2. Alternatively, the fixture can also be individual injection molded elements that are bonded precisely to each module.

Embodiments of a method to manufacture optoelectronic modules as well as the corresponding optoelectronic modules are described below with reference to FIGS. 14 to 19 showing the corresponding optoelectronic modules manufactured by the method. According to an embodiment of the method to manufacture the optoelectronic modules, a first (opto-mechanical) wafer 100 comprising a plurality of first module portions 101 is provided, wherein the first wafer 100 has a first surface S100a and an opposite second surface S100b. A second (optoelectronic) wafer 200 comprising a plurality of second module portions 201 is provided, wherein the second wafer 200 has a first surface S200a and an opposite second surface S200b. Each of the second module portions 201 comprises at least one optoelectronic component 210.

The first wafer 100 is disposed onto the second wafer 200 to provide a wafer stack such that the second surface S100b of the first wafer 100 is placed opposite to the first surface S200a of the second wafer 200 and each of the first module portions 101 is aligned to a respective one of the second module portions 201 so that light coupled in a respective one of the first module portions 101 is transferred to a respective one of the second module portions 201 and is directed to the respective at least one optoelectronic component 210 of the second module portions 201. The wafer stack is diced into individual dies respectively comprising one of the first (opto-mechanical) and one of the second (optoelectronic) module portions for respectively forming one of the optoelectronic modules 1.

According to a possible embodiment of the method to manufacture the optoelectronic modules, each of the first module portions 101 comprises at least a fixture 160 to hold an optical fiber 2. The at least one fixture 160 is made by a wafer scale process molding directly onto the first wafer 100 and/or using one of a single wafer with molded elements and several stacked wafers with varying holes and/or cut outs.

According to another possible embodiment of the method to manufacture the optoelectronic modules, at least one passive optical component 110 for each of the first module portions is provided on the first surface S100a of the first wafer 100. The first wafer 100 is disposed onto the second wafer 200 such that light coupled into the respective at least one passive optical component 110 of the first module portions 101 is coupled into the respective at least one optoelectronic component 210 of the second module portions 201.

According to another possible embodiment of the method to manufacture the optoelectronic modules, at least one of the first and second module portions 101, 201 is provided with at least one passive optical component 110a, 110b. The first wafer 100 is disposed onto the second wafer 200 to provide a wafer stack such that each of the first module portions 101 is aligned to a respective one of the second module portions 201 so that light coupled out of the optical fiber 2 held in the respective at least one fixture 160 of the first module portions 101 is coupled into the respective at least one passive optical component 110a, 110b of one of the first and second module portions 101, 201 at the first side of the respective at least one passive optical component and is coupled out at the second side of the respective at least one optical component and is directed to the respective at least one optoelectronic component 210 of the second module portions 201.

According to another possible embodiment of the method to manufacture the optoelectronic modules, a respective one of the at least one passive optical component 110a for each of the first module portions 101 is placed on the second surface S100b of the first wafer 100. The respective at least one optoelectronic component 210 of the second module portions 201 is placed on the first surface S200a of the second wafer 200.

According to another possible embodiment of the method to manufacture the optoelectronic modules, a respective one of the at least one passive optical component 110b for each of the second module portions is placed on the first surface S200a of the second wafer 200. The respective at least one optoelectronic component 210 of the second module portions 201 is placed on the second surface S200b of the second wafer 200.

According to another possible embodiment of the method to manufacture the optoelectronic modules, a respective first one of the at least one passive optical component 110a for each of the first module portions 101 is placed on the second surface S100b of the first wafer 100. A respective second one of the at least one passive optical component 110b for each of the second module portions 201 is placed on the first surface S200a of the second wafer 200. The respective at least one optoelectronic component 210 of the second module portions 201 is placed on the second surface S200b of the second wafer 200.

According to another possible embodiment of the method to manufacture the optoelectronic modules, the first wafer 100 is provided with a respective at least one light turning element 170 for each of the first module portions 101. The light turning element 170 is configured to change a direction of the light beam so that light is coupled between the respective one of the at least one optical fiber 2 coupled to the first module portions 101 and the respective at least one passive optical component 110a, 110b of the at least one first and second module portions 101, 201.

According to another possible embodiment of the method to manufacture the optoelectronic modules, at least one respective electronic component 310 is provided for each of the second module portions 201. The respective at least one electronic component 310 is placed on one of the first and second surface S200a, S200b of the second wafer 200.

According to another possible embodiment of the method to manufacture the optoelectronic modules, a covering element 500 is provided over the first surface S100a of the first wafer 100.

According to another possible embodiment of the method to manufacture the optoelectronic modules, a spacer wafer 600 is provided between the first wafer 100 and the second wafer 200. Alternatively, a spacer layer made by molding directly onto the first surface S200a of the second wafer 200 and/or the second surface S100b of the first wafer 100 may be provided.

According to another possible embodiment of the method to manufacture the optoelectronic modules, respective tapered and/or straight etched holes 190 are provided for each of the first module portions 101 in the material of the first wafer 100 to fix the front face of the respective at least one optical fiber 2 coupled to the first module portions 101 of the first wafer 100. Alternatively, respective straight holes and respective molded tapers for each of the first module portions 101 may be provided in the material of the first wafer 100 to fix the front face of the respective at least one optical fiber 2 coupled to the first module portions 101 of the first wafer 100.

According to a possible embodiment of the method to manufacture the optoelectronic modules, either the first and second wafers 100, 200 are respectively configured as glass wafers, or the first wafer 100 is configured as a glass wafer and the second wafer 200 is configured as one of a printed circuit board, ceramic substrate, electronic board and an SiP wafer.

The respective at least one passive optical component 110, 110a, 110b of one of the first and second module portions 101, 201 may comprise an optical lens. The respective at least one optoelectronic component 210 of the second module portions 201 may be configured as an optical emitter and/or an optical receiver. The respective at least one electronic component 310 of the second module portions 201 may be configured as an electrical driver and/or an electrical amplifier.

Several embodiments of an optoelectronic module comprising at least two stacked substrates, for example a first (opto-mechanical) substrate comprising optical components such as optical alignment components and beam deflection components and a second (optoelectronic) substrate comprising electronic and optoelectronic components such as transceiver ICs, VCSELs or PDs being cut out of the wafer stack of the bonded optoelectronic wafer 200 and an opto-mechanical wafer 100 are shown in FIGS. 14 to 19. The optoelectronic modules shown in FIGS. 14 to 19 additionally comprise other components, for example a spacer polymer. The spacer polymer could be a wafer in itself and thus many of the embodiments shown in FIGS. 14 to 19 may be based on 2-4 stacked wafers, as for example shown for the 3 stacked wafers of FIGS. 13A and 13B.

Figure 14:
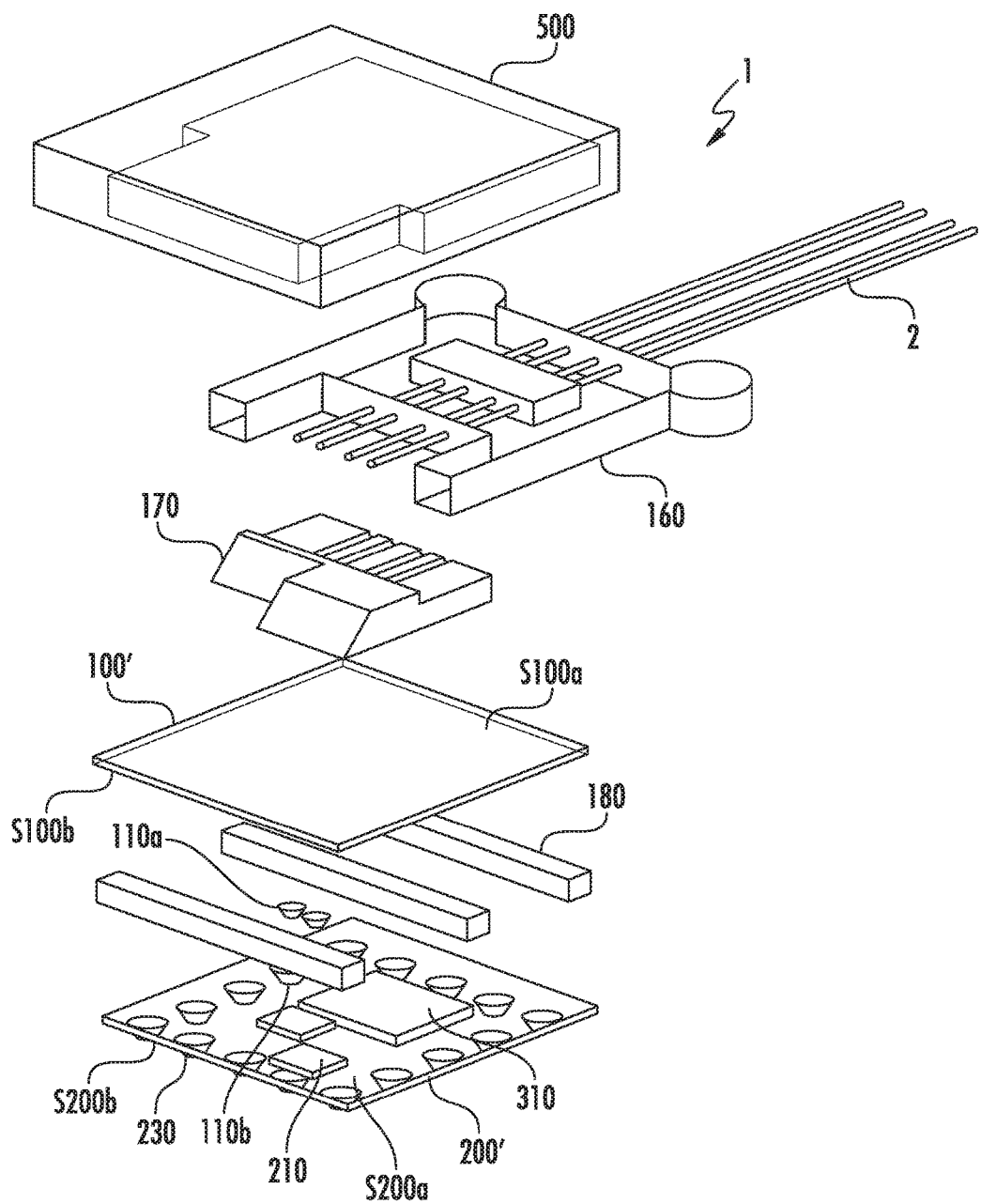
FIG. 14 shows an exploded view of several layers of an optoelectronic module.

FIG. 14 shows an exploded view of an optoelectronic module 1 manufactured with the method as described with reference to the wafer stack shown in FIG. 13A. The optoelectronic module comprises an opto-mechanical substrate 100', an optoelectronic substrate 200' and a spacer layer 180 that are cut out of the bonded wafer stack comprising the opto-mechanical wafer 100, the optoelectronic wafer 200 and the spacer wafer 600 as shown in FIG. 13A. A covering element 500 is provided to be disposed on the first surface S100a of the opto-mechanical substrate 100'.

A fixture 160 to hold the optical fibers 2 is arranged on the first surface S100a of the opto-mechanical substrate 100'. A light turning element 170 including a fiber alignment structure is placed on the first surface S100a of the opto-mechanical substrate 100'. The light turning element 170 is either molded directly onto the surface or placed with precision and created using injection molding. First passive optical components 110a, for example lenses, are placed on the second surface S100b of the opto-mechanical substrate 100'. Spacer layers 180 are provided, wherein the spacer layers 180 may be placed on the second surface S100b of the opto-mechanical substrate 100' or on the first surface S200a of the optoelectronic wafer 200 or both surfaces S100b and S200a. It is also possible to provide a separate spacer wafer in various manufacturing stackups. The opto-mechanical substrate 100' may be configured as a glass substrate. The light turning element 170 with the fiber alignment structure may be configured as a molded polymer layer, and the first passive optical components 110a may be configured as another molded polymer layer and the spacer layers 180 may be molded as another polymer or a separate machined wafer and disposed on the glass substrate 100' fabricated as one component.

The optoelectronic substrate 200' may comprise second passive optical component 110b being disposed on a first surface S200a of the optoelectronic substrate 200'. The second passive optical components 110b may be configured as one molded polymer layer being disposed on a glass substrate 200'. The optoelectronic substrate 200' further comprises electronic components 310, such as transceivers. Solder ball contacts 230 to reflow the module on a PCB substrate and a metallization for an optoelectronic component 210, for example a VCSEL or a PD, are disposed on the second surface S200b of the optoelectronic substrate 200'.

Figure 15A:
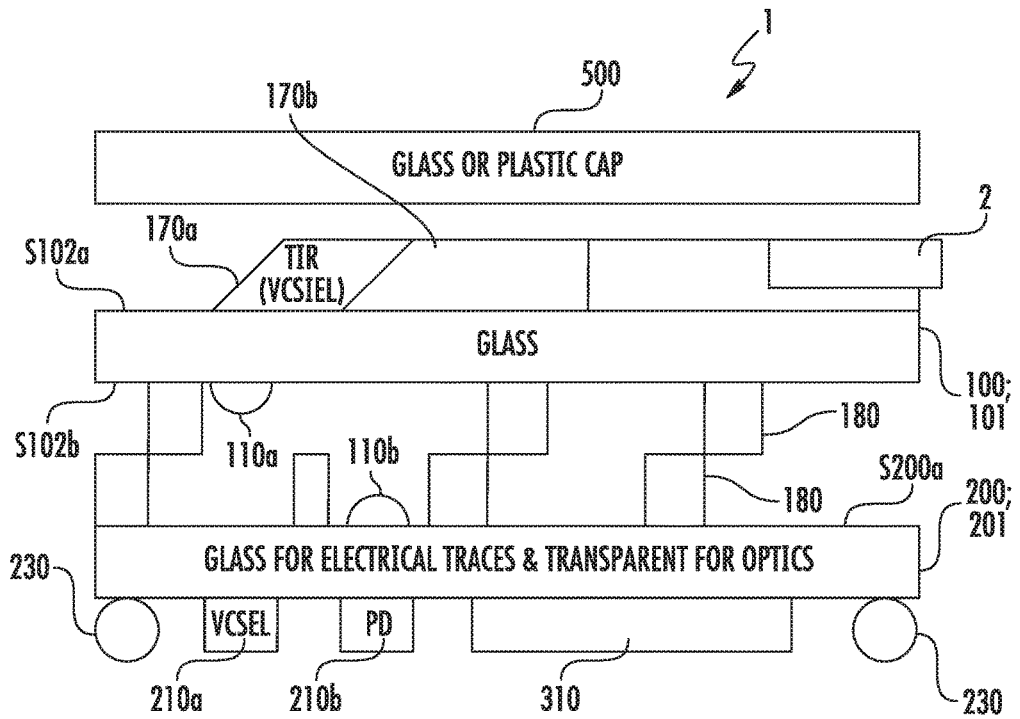
FIG. 15A shows an embodiment of several substrates to be stacked above each other for manufacturing an optoelectronic module.
Figure 15B:
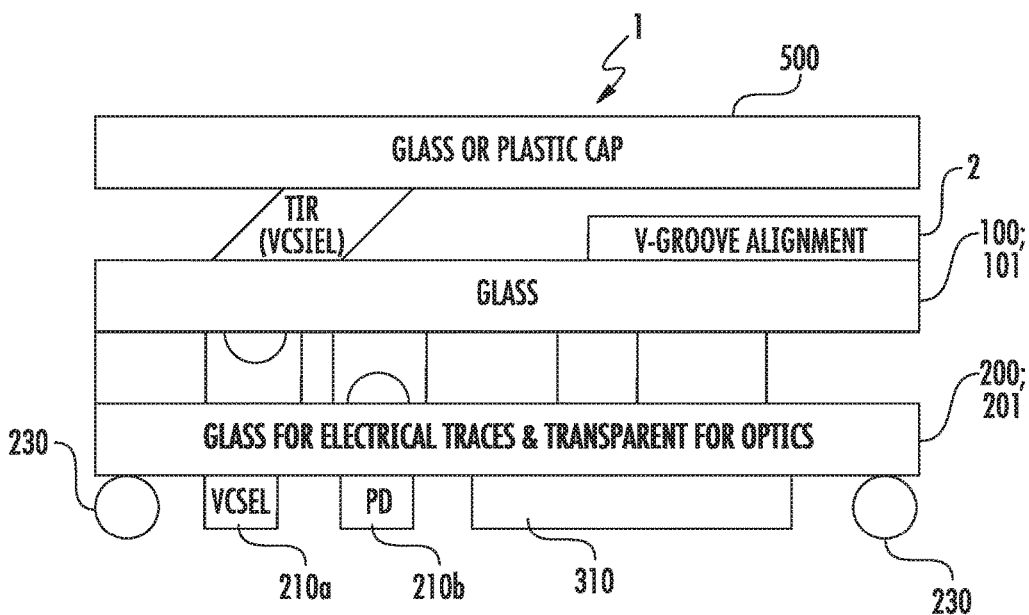
FIG. 15B shows an embodiment of stacked substrates of an optoelectronic module.

FIG. 15A shows a two-dimensional exploded view of the optoelectronic module 1 as shown in FIG. 14 in a perspective exploded view. FIG. 15B shows an embodiment of an optoelectronic module 1 of FIG. 15A manufactured with the method described with reference to the wafer stack shown in FIG. 13A. The optoelectronic module comprises an opto-mechanical substrate 100', an optoelectronic substrate 200' and a spacer layer 180 that are cut out of the bonded wafer stack comprising the opto-mechanical wafer 100, the optoelectronic wafer 200 and the spacer wafer 600 as shown in FIG. 13A. The opto-mechanical substrate 100' and the optoelectronic substrate 200' may be made of glass being transparent for the light transferred in the optical fiber 2. A covering element 500 that can be made of glass or plastic is disposed on the first surface S100a of the opto-mechanical substrate 100'.

A fixture 160 to hold the optical fiber 2 is arranged on the first surface S100a of the opto-mechanical substrate 100'. Light turning elements 170a and 170b are disposed on the first surface S100a of the opto-mechanical substrate 100'. First passive optical components 110a, for example lenses, are placed on the second surface S100b of the opto-mechanical substrate 100'. Spacer layers 180 are placed on the second surface S100b of the opto-mechanical substrate 100' and on the first surface S200a of the optoelectronic substrate 200'. The opto-mechanical substrate 100' may be configured as a glass substrate.

The optoelectronic substrate 200' comprises second passive optical components 110b, for example lenses, being disposed on the first surface S200a of the optoelectronic substrate 200'. The optoelectronic substrate 200' further comprises electronic components 310, such as transceivers. Solder ball contacts 230 to reflow the module on a PCB substrate and optoelectronic components 210, for example a VCSEL or a PD, are disposed on the second surface S200b of the optoelectronic substrate 200'.

The optoelectronic module 1 has a first optical path comprising the light turning element 170a and the optical lens 110a. Light coupled out of the optoelectronic component 210a being configured as a VCSEL is coupled out of the VCSEL 210a and coupled in the lens 110a. The light is coupled through the opto-mechanical substrate 100' into the light turning element 170a from which it is deflected towards the optical fiber 2. The optoelectronic module 1 has a second optical path comprising the light turning element 170b and the optical lens 110b. Light coupled out of the optical fiber 2 is deflected by the light turning element 170b through the opto-mechanical substrate 100' towards the optical lens 110b. The lens 110b focuses the light to the optoelectronic component 210b that can be configured as a photodiode.

Figure 16A:
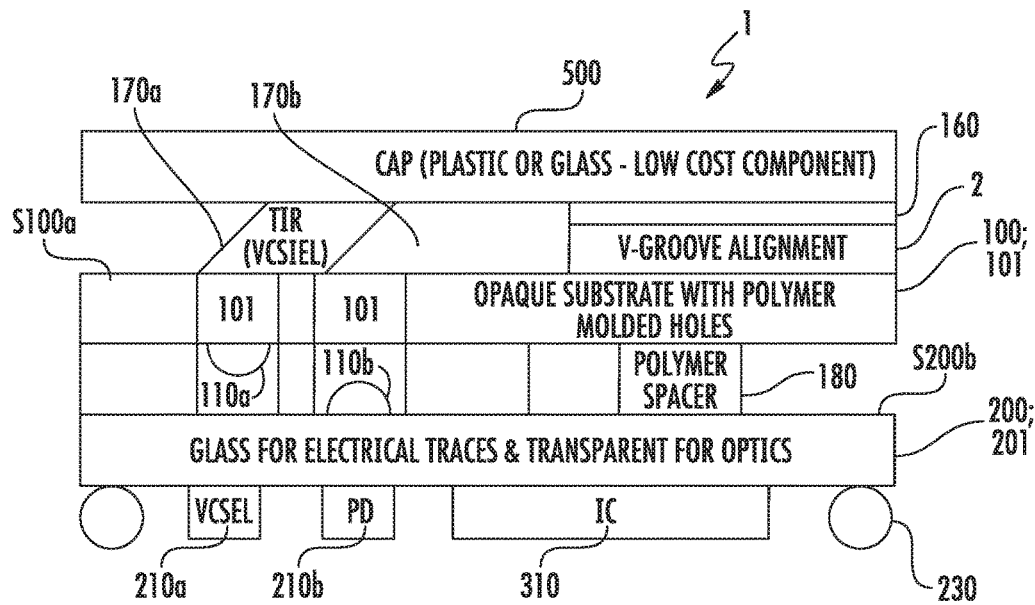
FIG. 16A shows an embodiment of stacked substrates of an optoelectronic module.
Figure 16B:
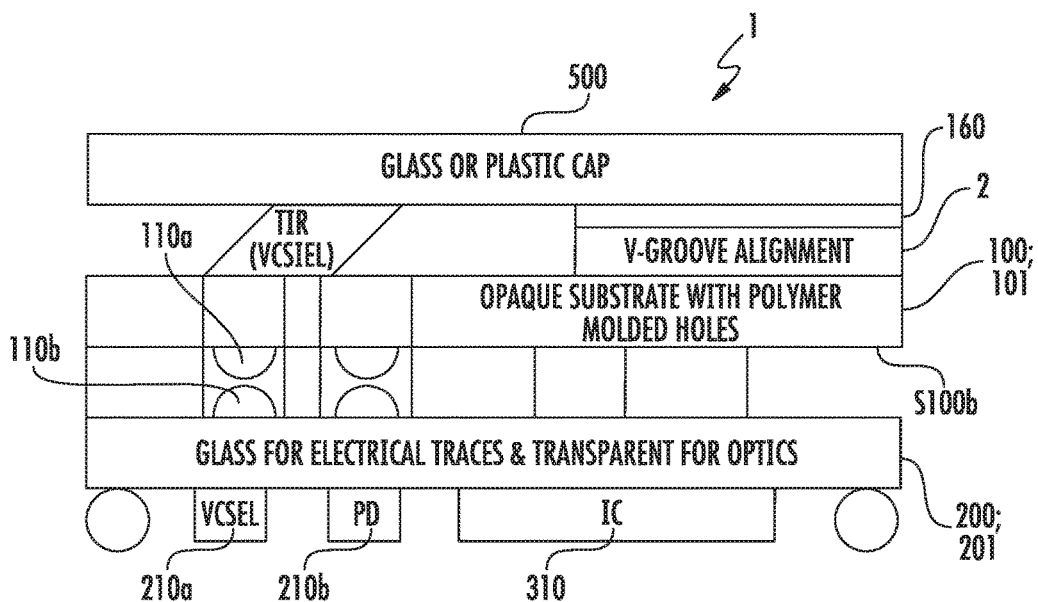
FIG. 16B shows an embodiment of stacked substrates of an optoelectronic module.

FIGS. 16A and 16B respectively show other embodiments of an optoelectronic module 1 manufactured with the method described with reference to the wafer stack shown in FIG. 13A. The optoelectronic modules shown in FIGS. 16A and 16B comprise an opto-mechanical substrate 100' and an optoelectronic substrate 200' that are cut out of the bonded wafer stack comprising the opto-mechanical wafer 100 and the optoelectronic wafer 200 as shown in FIG. 13A The opto-mechanical substrate 100' may be made of a material being opaque for the light transferred in the optical fiber 2. A covering element 500 that can be made of glass or plastic is disposed on the first surface S100a of the opto-mechanical substrate 100'.

The optoelectronic module 1 shown in FIG. 16A comprises the same arrangement of the fixture 160 and the light-turning elements 170a, 170b on the first surface S100a of the opto-mechanical substrate 100' and first passive optical components 110a, for example lenses, as well as spacer layers 180 on the second surface S100b of the opto-mechanical substrate 100' as shown in FIG. 15A.

The optoelectronic substrate 200' comprises the same arrangement of the second passive optical components 110b, for example lenses, and spacer layers 180 on the first surface S200a of the optoelectronic substrate 200' and electronic components 310, such as transceivers, solder ball contacts 210 and optoelectronic components 210, for example a VCSEL or a PD, on the second surface S200b of the optoelectronic substrate 200' as shown for the optoelectronic module in FIG. 15A.

The opto-mechanical substrate 100' may comprise cavities 101 within the opaque material of the opto-mechanical substrate 100'. The cavities may be filled with a material of polymer to provide a light transmission path between the light turning elements 170a, 170b and the first and second passive optical components 110a and 110b.

FIG. 16B shows a similar embodiment of an optoelectronic module as shown in FIG. 16A with the difference that first passive optical components 110a and second passive optical components 110b, such as lenses, are disposed opposite to each other on the second surface S100b of the opto-mechanical substrate 100' and the first surface S200a of the optoelectronic substrate 200'. Additional embodiments not shown can have the optical components placed in other configurations, such as both on surface S100b or both on surface S200a.

Figure 17A:
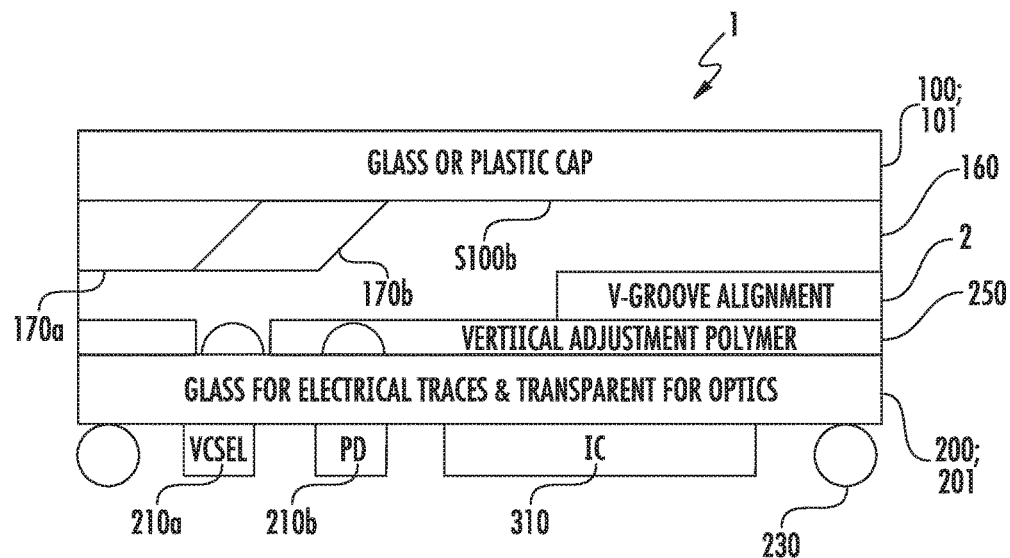
FIG. 17A shows an embodiment of several substrates to be stacked above each other for manufacturing an optoelectronic module.
Figure 17B:
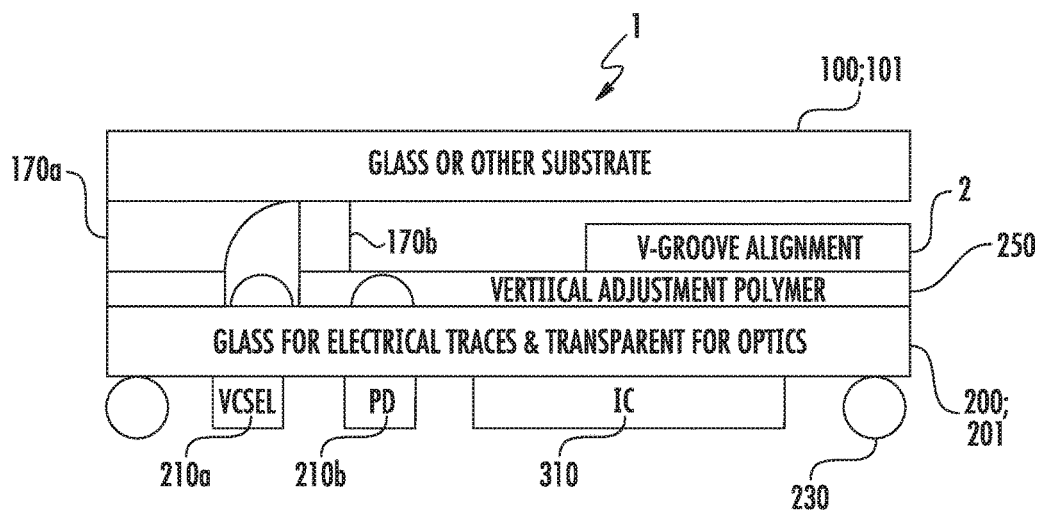
FIG. 17B shows an embodiment of stacked substrates of an optoelectronic module.

FIGS. 17A and 17B respectively show an embodiment of an optoelectronic module 1 manufactured with the method described with reference to the wafer stack shown in FIG. 13A. The optoelectronic module comprises an opto-mechanical substrate 100' and an optoelectronic substrate 200' that are cut out of the bonded wafer stack comprising the opto-mechanical wafer 100 and the optoelectronic wafer 200 as shown in FIG. 13A. The opto-mechanical substrate 100' and the optoelectronic substrate 200' may be made of glass being transparent for the light transferred in the optical fiber 2. The top substrate 100' acts as supporting means for the opto-mechanical components and additionally as a cover. The light turning elements 170a, 170b acts as mirrors having a metal or similar coating to be reflective.

Light turning elements 170a and 170b as well as a fiber alignment fixture 160 are arranged on the second surface S100b of the opto-mechanical substrate 100'. Passive optical components 110a, 110b as well as a vertical adjustment polymer layer 250 are disposed on the first surface S200a of the optoelectronic substrate 200'. The vertical adjustment polymer layer 250 can be a portion of the spacer wafer 600. The optoelectronic substrate 200' further comprises electronic components 310, such as transceivers, solder ball contacts 230 to reflow the module on a PCB substrate and optoelectronic components 210, for example a VCSEL or a PD, that are disposed on the second surface S200b of the optoelectronic substrate 200'.

The optoelectronic module 1 shown in FIG. 17B is embodied in a similar way as shown for the optoelectronic module of FIG. 17A with the difference that a curvature is added to the light turning elements 170a and 170b being configured as metal coated mirrors.

Figure 18A:
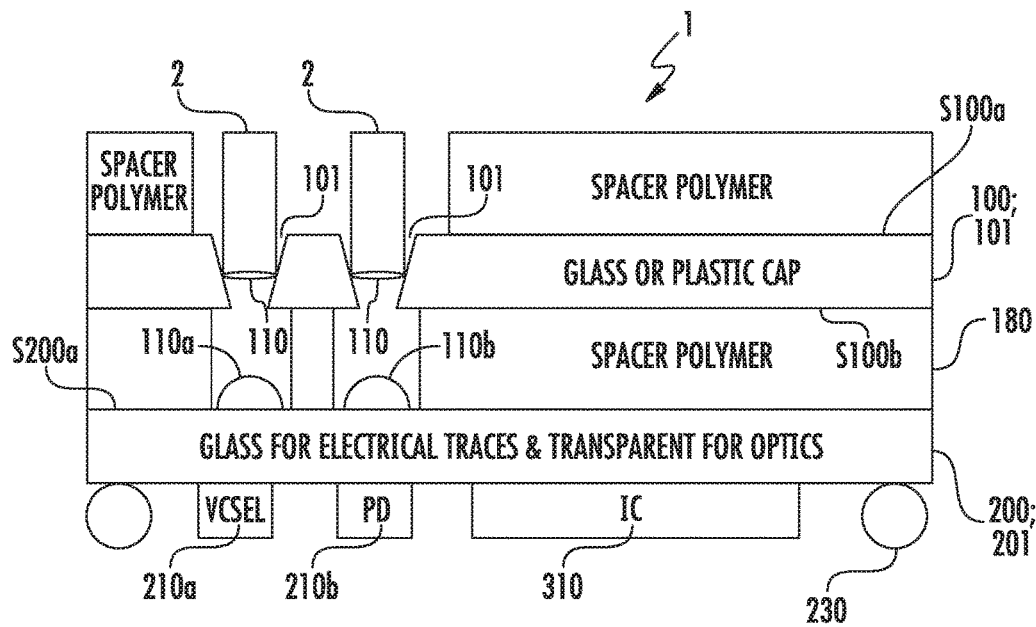
FIG. 18A shows an embodiment of stacked substrates of an optoelectronic module.
Figure 18B:
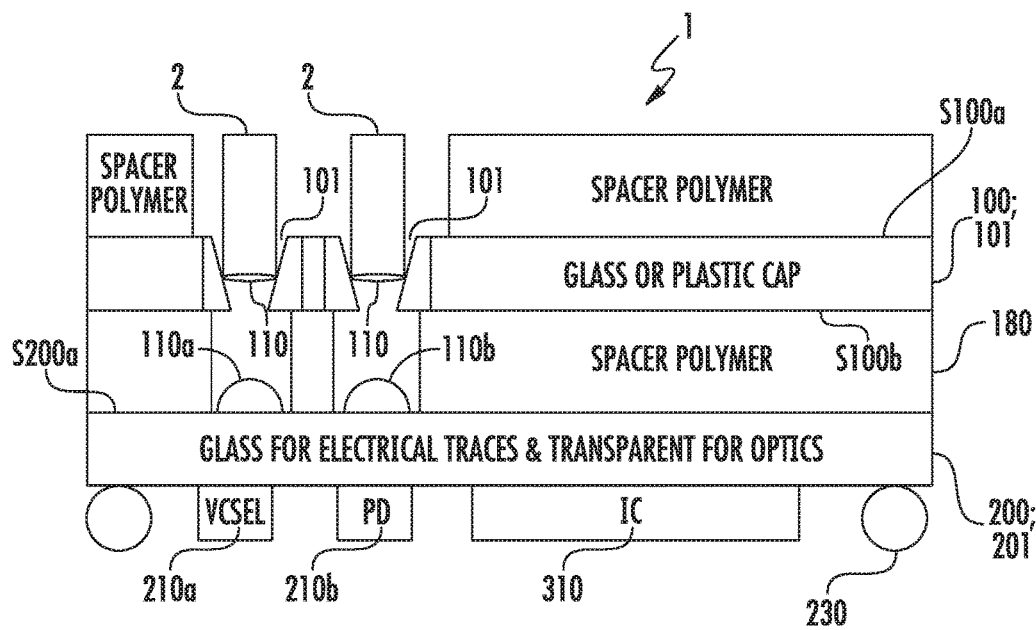
FIG. 18B shows an embodiment of stacked substrates of an optoelectronic module.
Figure 18C:
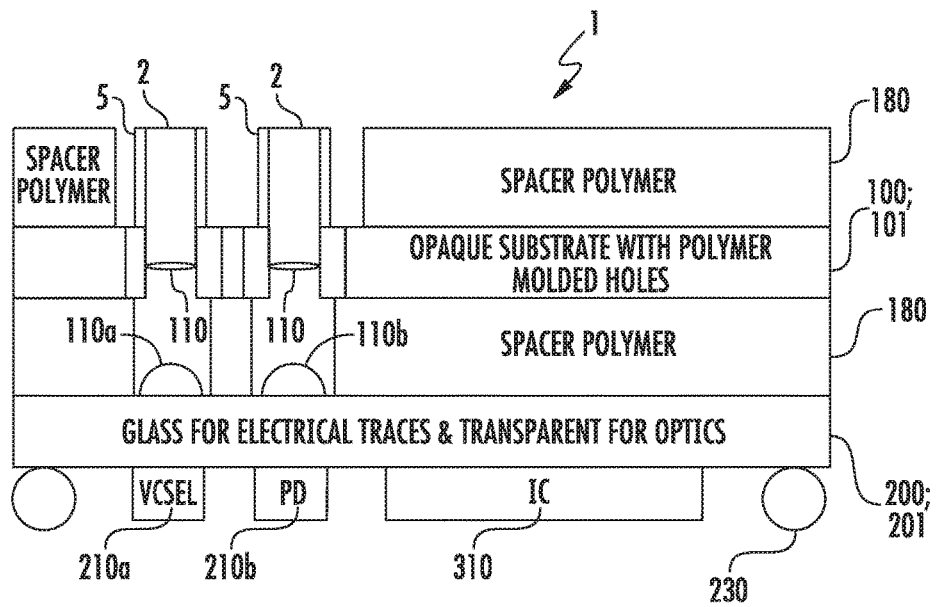
FIG. 18C shows an embodiment of stacked substrates of an optoelectronic module.

FIGS. 18A to 18C respectively show embodiments of an optoelectronic module 1 manufactured with the method described with reference to the wafer stack shown in FIG. 13A. The optoelectronic module comprises an opto-mechanical substrate 100' and an optoelectronic substrate 200' that are cut out of the bonded wafer stack comprising the opto-mechanical wafer 100 and the optoelectronic wafer 200 as shown for the wafer stack in FIG. 13A.

The opto-mechanical substrate 100' comprises cavities 101 to insert optical fibers 2. Spacer layers 180 are disposed on the first and second surface S100a and S100b of the opto-mechanical substrate 100'. The optoelectronic substrate 100' can be made of glass being transparent for the light transferred through the optical fiber 2 and for arranging electrical traces. First and second passive optical components 110a and 110b, for example lenses, are disposed on the first surface S200a of the optoelectronic substrate 200'. The optoelectronic substrate 200' further comprises electronic components 310, such as transceivers, solder ball contacts 230 to reflow the module on a PCB substrate and optoelectronic components 210, for example a VCSEL or a PD, that are disposed on the second surface S200b of the optoelectronic substrate 200'. The optoelectronic components and the electronic components are arranged on the same substrate for electrical integrity.

The opto-mechanical substrate 100' may be made of glass, wherein the cavities 101 are configured as tapered etched holes 190. According to the embodiment of the optoelectronic module shown in FIG. 18A, the optical fibers 2 are inserted in the tapered etched holes. According to the embodiment of the optoelectronic module shown in FIG. 18B, the opto-mechanical substrate 100' is configured to be made of a material being opaque for the light transferred through the optical fibers 10. The opto-mechanical substrate 100' comprises cavities 101 formed as tapered polymer molded holes 190 in which the optical fibers 2 are inserted. The optoelectronic module 1 shown in FIG. 18C is embodied similar as shown for the optoelectronic module of FIG. 18B with the difference that the polymer molded holes do not taper and are provided with a hard cladding or ferrule 5 acting a fiber stop means.

Figure 19:
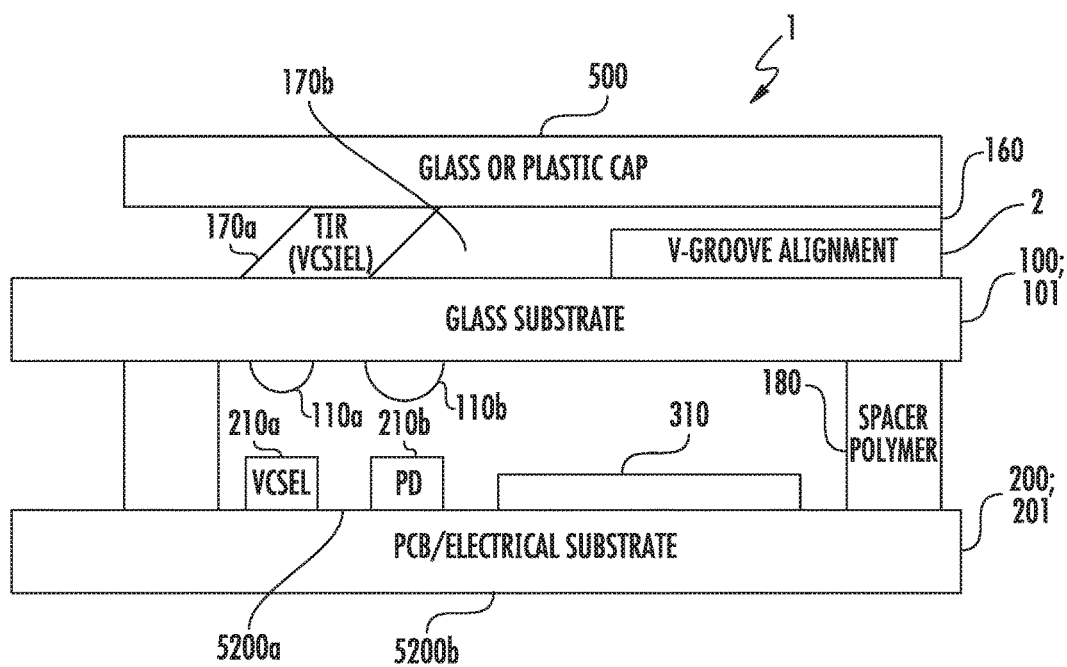
FIG. 19 shows an embodiment of stacked substrates of an optoelectronic module.

FIG. 19 shows an embodiment of an optoelectronic module 1 comprising the opto-mechanical substrate 100' and the optoelectronic substrate 200'. In contrast to the embodiments shown in FIGS. 14 to 18C the optoelectronic components, such as VCSEL/PD, are wirebonded onto an optoelectronic wafer 200 being embodied as a PCB or similar electronic board with electrical traces and vias to connect this module externally to a larger PCB or electronic board later after dicing. The stack arrangement is manufactured at the wafer scale with the PCB being a wafer.

The substrate 100' may be made of glass having a first surface S100a on which a fixture 160 for holding and aligning an optical fiber 2 and light turning elements 170a, 170b are disposed. A cap 500 made of glass or a plastic material is disposed on the first surface S100a of the opto-mechanical substrate 100'. Passive optical components 170, such as lenses, are disposed on a second surface S100b of the opto-mechanical substrate 100'.

The opto-mechanical substrate 100' is mounted onto the optoelectronic substrate 200', for example a PCB. The optoelectronic substrate 200' comprises optoelectronic components 210a, 210b being embodied as VCSELs or PDs and arranged on a first surface S200a of the optoelectronic substrate. An electronic component 310, for example a transceiver IC, may also be mounted onto the first surface S200a of the optoelectronic substrate 200'. Electrical contact pads are provided on the second surface S200b of the optoelectronic substrate 200'. A spacer layer 180 is arranged between the second surface S100b of the opto-mechanical substrate 100' and the first surface S200a of the optoelectronic substrate 200'. The scale unit given in FIG. 19 is just a possible orientation and does not restrict the components of the embodiment to the specified values.

The opto-mechanical substrate 100' is aligned to the optoelectronic substrate 200' at the wafer scale so that light may be transferred through a first optical path from the optoelectronic transmitter 210a through the lens 110a and the glass substrate 100' to the light turning mirror 170a that deflects the light such that it is coupled into the optical fiber 2. The opto-mechanical substrate 100' is further aligned to the optoelectronic substrate 200' so that light may be transferred through a second optical path from the optical fiber 2 to the light turning mirror 170b that deflects the light towards the lens 110b from which the light is coupled out towards the optoelectronic receiver 210b.

In conclusion, the different embodiments of the method to manufacture optoelectronic components substantially reduce the cost of assembling devices comprising electronic integrated circuits, optoelectronic sources and detectors, optical components and waveguides such as lenses and fiber. The embodiments of the method allow fabricating multiple devices in parallel and aligning them at the wafer-scale thereby increasing assembly throughput. Testable sub-assemblies are fabricated by dicing the stacked wafers that allows verification of the critical precision alignments and device functionality prior to additional assembly thereby reducing the loss of other components due to fallout. The optoelectronic sub-assemblies built by the described embodiments of the method are compatible with low cost electronic circuit board fabrication technology, such as surface-mount technology (SMT). The embodiments of the method provide a path toward high-speed assembly at low-cost due to tight alignment tolerances and controlled electrical connectivity and allow volume manufacturing that can scale cost down as demand increases. Furthermore, the need for wirebonding in some embodiments is eliminated which improves impedance control of the electrical lines as well as vibration tolerance for automotive or other such applications.

Another benefit to the specified approach is that the placement of the optical emitter/receiver can be nearly anywhere in the plane of the module instead of near the perimeter as in many pick-and-place designs where the electronic chip and optoelectronic chips are on a common substrate. With this freedom, the likely ideal placement would be toward the center of the module so that the mechanical features holding the fiber in alignment can also be centered.

We claim:

1. An optoelectronic module, comprising:
   a first substrate comprising a first module portion of the optoelectronic module including at least one passive optical component;
   a second substrate comprising a second module portion of the optoelectronic module including at least one optoelectronic component;
   a third substrate comprising a third module portion of the optoelectronic module, wherein the third module portion comprises at least one electronic component;
   wherein the first substrate has a first surface and a second opposite surface, wherein the at least one passive optical component is arranged on the first surface of the first substrate;
   wherein the at least one passive optical component has a first and a second side and is configured to modify a beam of light such that a direction of light coupled in the at least one passive optical component at the first side is changed and coupled out of the at least one passive optical component at the second side;
   wherein the second substrate comprises metalized via holes extending in a material of the second substrate from a first surface of the second substrate to an opposite second surface of the second substrate, wherein the at least one optoelectronic component is electrically connected to the metalized via holes;
   wherein the second substrate is bonded onto the third substrate such that the at least one electronic component of the third module portion is electrically coupled to the at least one optoelectronic component of the second module portion by the metalized via holes of the second substrate;
   wherein the first substrate is bonded onto the second substrate such that the first module portion is aligned to the second module portion so that light coupled into the at least one optical component of the first module portion at the first side of the at least one optical component is coupled out at the second side of the at least one optical component and is directed to the at least one optoelectronic component of the second module portion.

2. The optoelectronic module of claim 1,
   wherein the third substrate comprises electrical contact pads of the third module portion, wherein the electrical contact pads are electrically coupled to the at least one electronic component of the third module portion and wherein the respective electrical contact pads are arranged on a first surface of the third substrate;
   wherein the second substrate is bonded onto the third substrate such that the electrical contact pads of the third substrate are electrically connected to the metalized via holes of the second substrate;
   wherein the first substrate comprises metalized via holes extending from a first surface of the first substrate to a second opposite surface of the first substrate;
   wherein the second substrate comprises electrical contact pads on the first surface of the second substrate, wherein the electrical contact pads are electrically connected to the metalized via holes of the second substrate; and
   wherein the first substrate is bonded onto the second substrate such that the electrical contact pads of the second substrate are electrically connected to the metalized via holes of the third substrate.

3. The optoelectronic module of claim 1, comprising:
   a fourth substrate arranged between the second and the third substrate, wherein the fourth substrate comprises metalized via holes in a material of the fourth substrate, wherein the metalized via holes are arranged to electrically couple the respective electrical contact pads of the third module portion to the respective electrical contact pads of the second module portion.

4. The optoelectronic module of claim 1, comprising:
   at least one fixture being arranged on the first surface of the first substrate to couple at least one optical fiber to the first module portion, wherein the at least one fixture is configured to hold the at least one optical fiber and to align the at least one optical fiber to the at least one passive optical component such that light is coupled between the at least one optical fiber and the at least one passive optical component of the first module portion.

* * * * *